(12) United States Patent
Hegde

(10) Patent No.: US 6,705,795 B2
(45) Date of Patent: Mar. 16, 2004

(54) ATTACHMENT MECHANISM

(75) Inventor: Shankar Hegde, Annassandrapalya Bangalore (IN)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/982,328

(22) Filed: Oct. 15, 2001

(65) Prior Publication Data

US 2003/0072608 A1 Apr. 17, 2003

(51) Int. Cl.[7] .................................................. F16B 2/02
(52) U.S. Cl. .................... 403/327; 403/321; 403/322.1; 403/325; 403/330; 24/458; 292/241; 292/242; 248/500; 248/510; 411/552
(58) Field of Search ............................... 248/500, 505, 248/506, 510; 403/321, 322.1, 322.2, 322.3, 322.4, 325, 326, 327, 330; 24/458; 292/242, 241, 63, 69, 109, 114, 129, DIG. 38; 411/552, 553, 550, 549

(56) References Cited

U.S. PATENT DOCUMENTS

| | | | |
|---|---|---|---|
| 3,752,519 A | * | 8/1973 | Nordell et al. .......... 292/129 X |
| 5,684,676 A | * | 11/1997 | Lin ........................ 248/510 X |
| 5,977,622 A | | 11/1999 | Mertol |
| 2001/0002729 A1 | | 6/2001 | Wong et al. |
| 2001/0003306 A1 | | 6/2001 | Cook |
| 2001/0006454 A1 | | 7/2001 | Huang et al. |
| 2001/0010624 A1 | | 8/2001 | Katsui |
| 2001/0013405 A1 | | 8/2001 | Mangold |

* cited by examiner

*Primary Examiner*—Lynne H. Browne
*Assistant Examiner*—Ryan M. Flandro
(74) *Attorney, Agent, or Firm*—Trueman H. Denny III

(57) ABSTRACT

An attachment mechanism for connecting a cooling device with a component to be cooled and carried by a connector is disclosed. The attachment mechanism includes a plate, a bore that connects with a portion of the cooling device, a hinge that can be removably hinged on the connector, and a latch assembly that includes tilt relief profiles that allow the latch assembly to pivot on the plate so that a latch profile on the latch assembly can be removably latched on the connector. The latch assembly further includes a spring locator and a spring that are positioned within a slot in the latch assembly and hold the spring pre-loaded in compression. When the latch assembly is tilted on the plate, the latch profile is pivoted outward to facilitate latching onto the connector. After latching onto the connector, the spring is further compressed and exerts a load between the cooling device and the component to be cooled such that contact resistance is reduced and thermal transfer is increased. The magnitude of the load force can be increased or decreased by selection of the springs properties. The latch assembly can include a handle adapted to be gripped by a hand so that the latch assembly can be latched or unlatched with the connector without the use of tools.

20 Claims, 17 Drawing Sheets

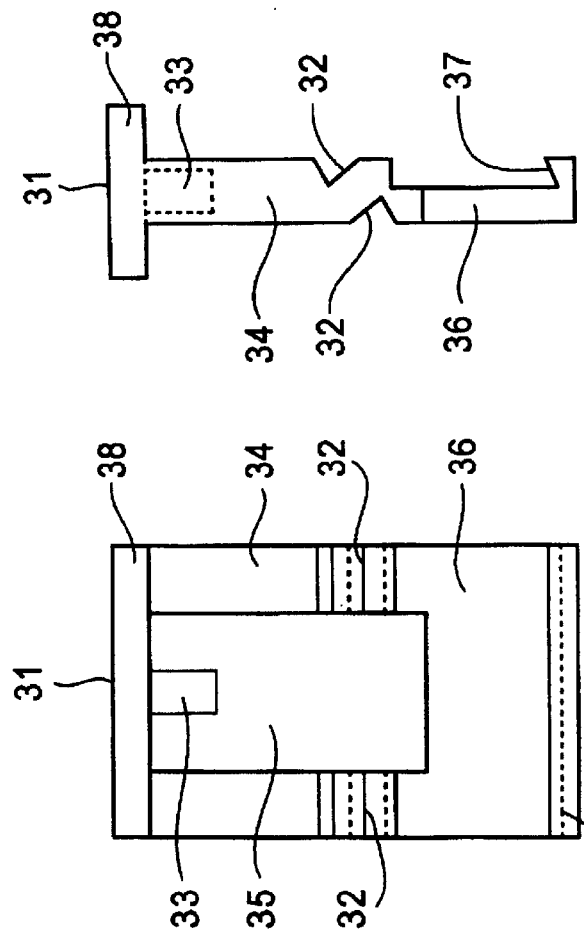
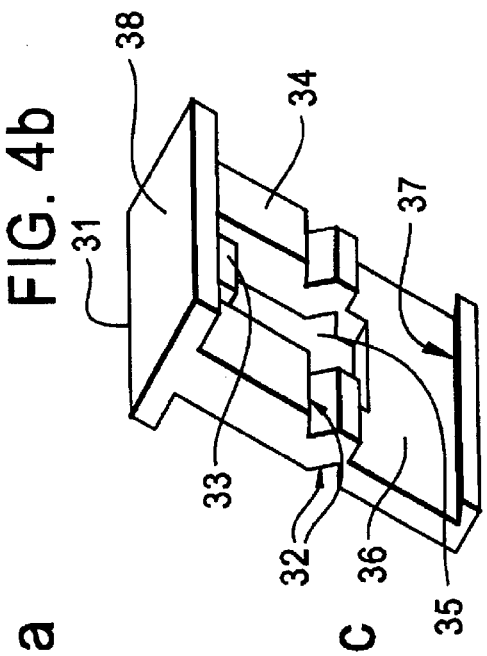
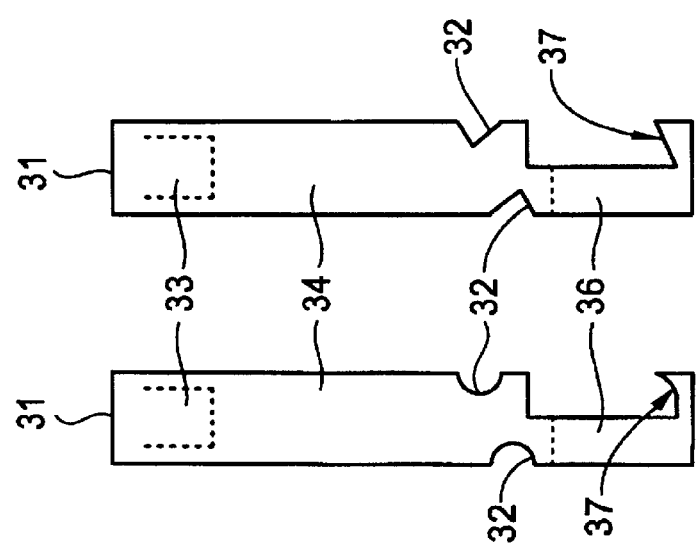

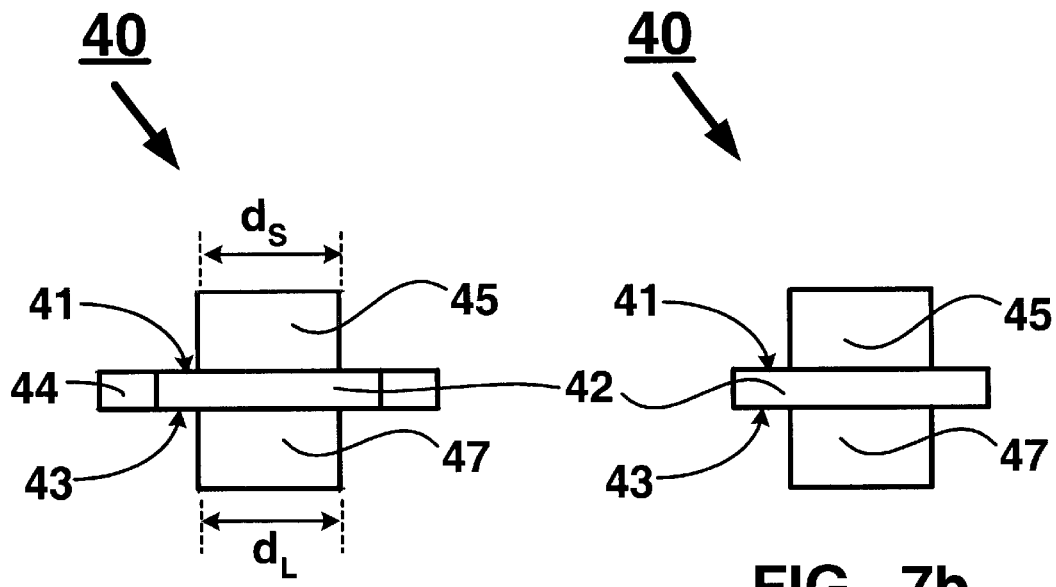
FIG. 7a
FIG. 7b
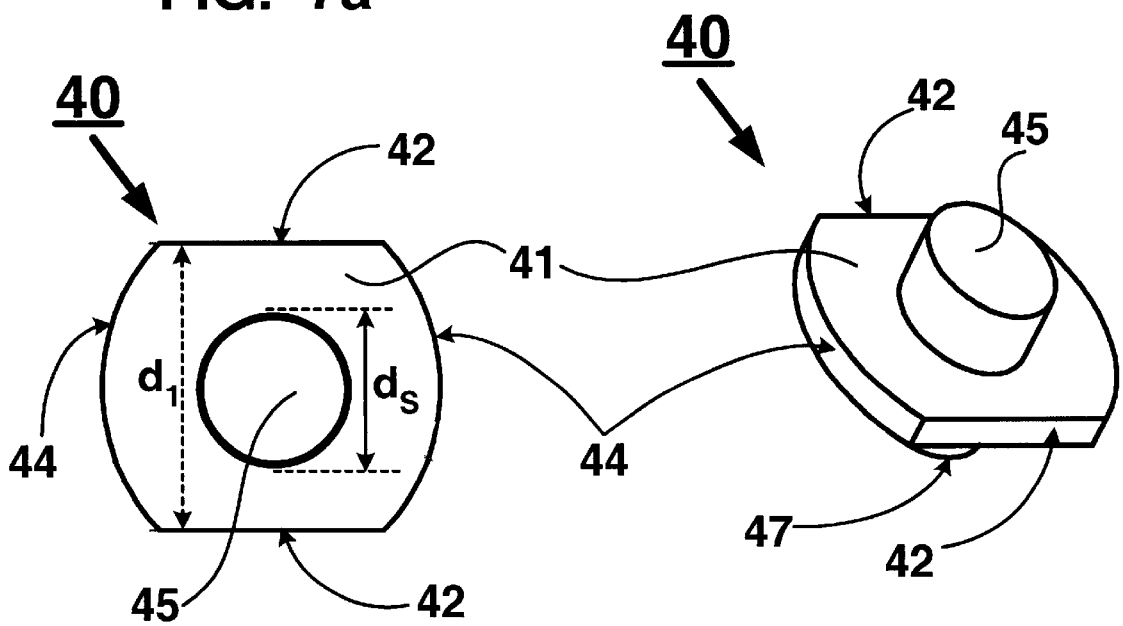
FIG. 7c
FIG. 7d

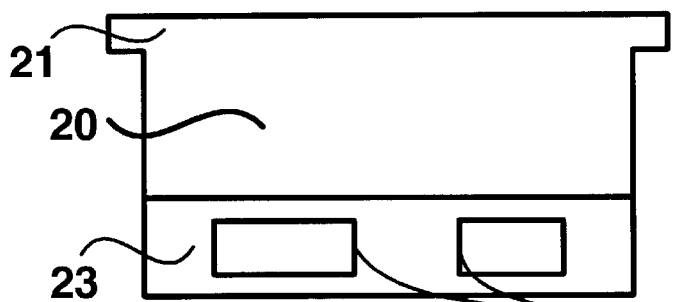
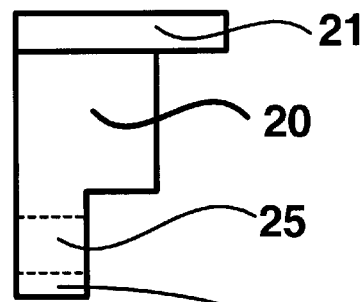
FIG. 8a  FIG. 8b
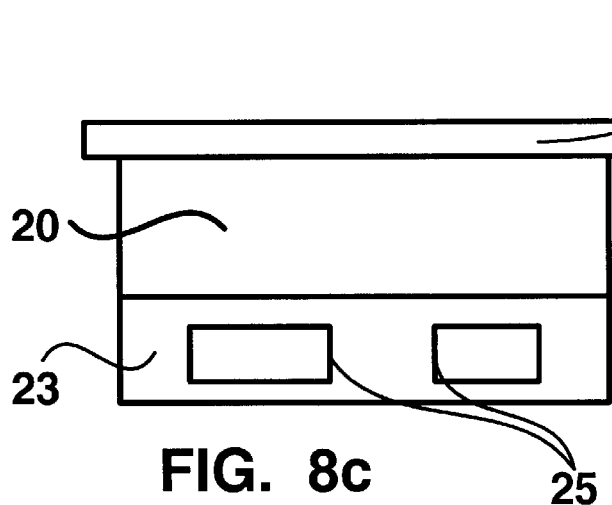
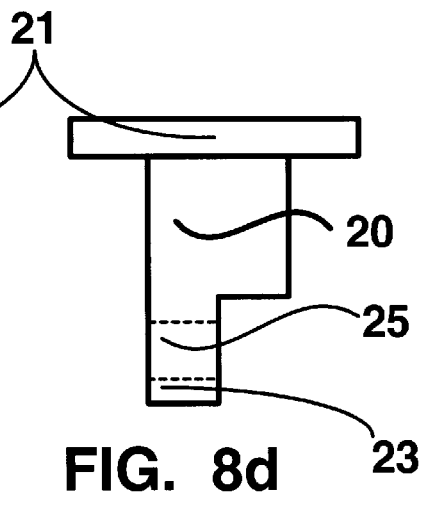
FIG. 8c  FIG. 8d
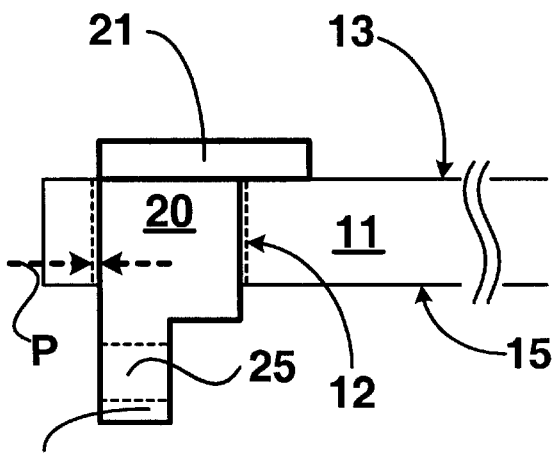
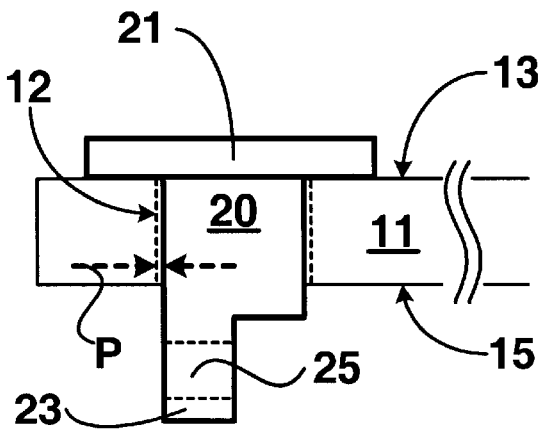
FIG. 9a  FIG. 9b

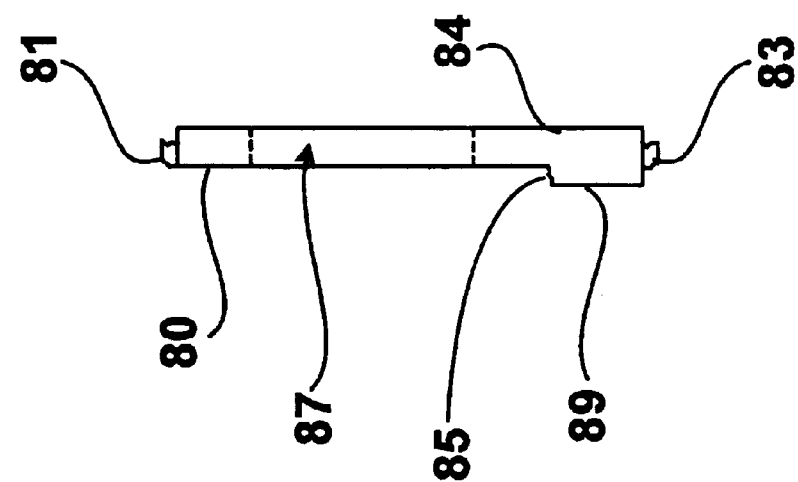
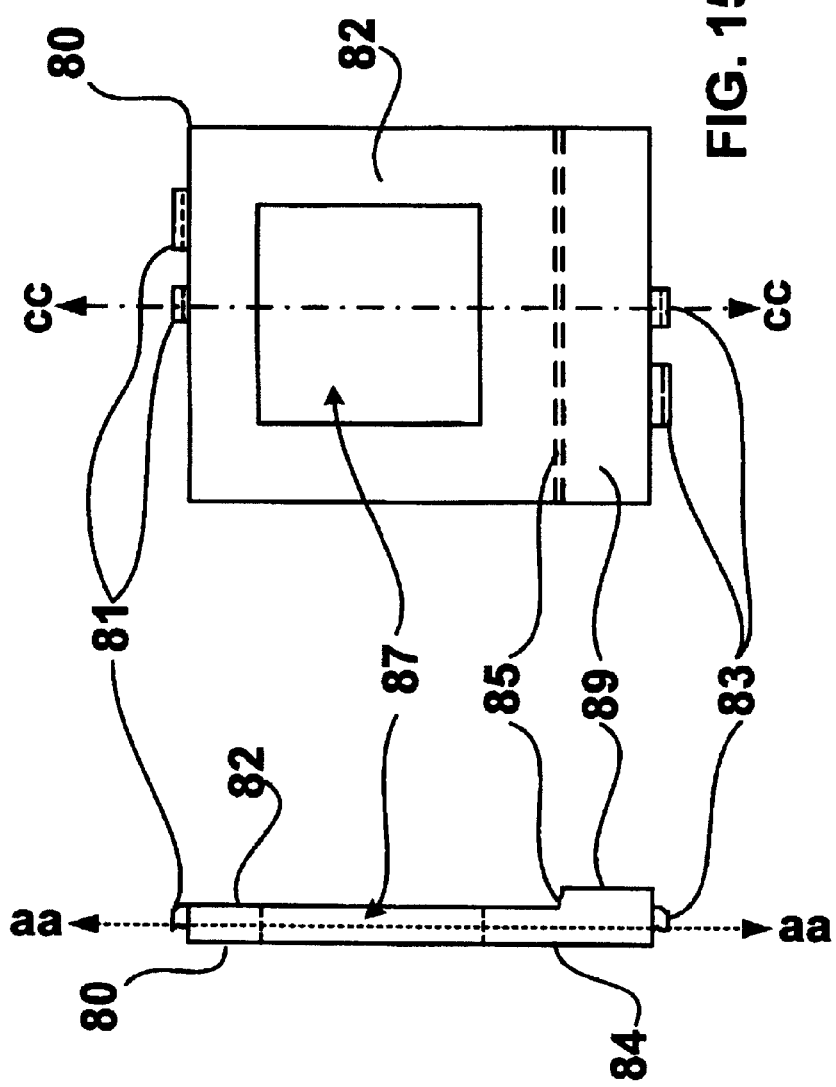
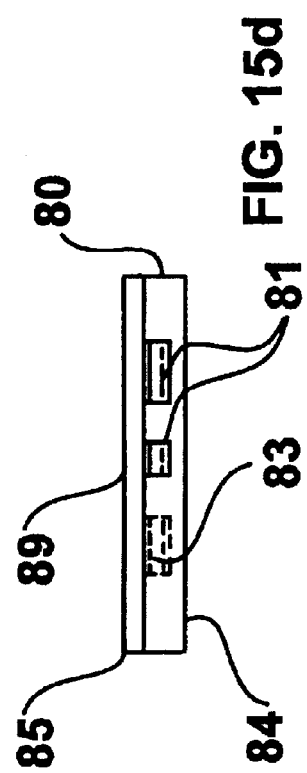
FIG. 15a
FIG. 15b
FIG. 15c
FIG. 15d

ATTACHMENT MECHANISM

FIELD OF THE INVENTION

The present invention relates generally to an attachment mechanism for mounting a cooling device to a component to be cooled. More specifically, the present invention relates to an attachment mechanism including a plate with a hinge and a pivotally mounted latch assembly for connecting a cooling device carried by the plate with a component to be cooled.

BACKGROUND OF THE INVENTION

It is well known in the electronics art to place a heat sink in contact with an electronic device so that waste heat generated by operation of the electronic device is thermally transferred into the heat sink thereby cooling the electronic device. With the advent of high clock speed electronic devices such as microprocessors ($\mu$P), digital signal processors (DSP), and application specific integrated circuits (ASIC), the amount of waste heat generated by those devices and the operating temperature of those devices are directly proportional to clock speed. Therefore, higher clock speeds result in increased waste heat generation which in turn increases the operating temperature of the device. However, efficient operation of the device requires that waste heat be effectively removed.

Heat sink devices came into common use as a preferred means for dissipating waste heat from electronic devices such as the types described above. In a typical application, a component to be cooled is carried by a connector that is mounted on a PC board. Efficient dissipation of heat from the component by the heat sink depends to a large extent on the thermal contact between the heat sink and the component and the contact pressure between the heat sink and the component. Ideally, an attachment device, such as a clip, positions the heat sink so that the a surface of the heat sink that is in contact with the component is substantially flat and the contact pressure between the heat sink and component acts along a load axis that is centered on the component.

There are, however, several disadvantages to prior clips for mounting a heat sink to a component. First, many of the prior clips are manufactured from a raw material such as spring steel or Stainless Steel, for example. The raw material that is ultimately selected must be of a punch and formable grade. Consequently, a spring rate of the material selected must be low and the hardness of the material must also be low so that a punch step and a forming step that are used to manufacture the clip can successfully punch and form the material into a clip. If the spring rate and hardness of the material are too high, then the material will be extremely difficult to punch and form. Additionally, a lifetime of a die that is used to punch and form the material will be reduced.

Second, the aforementioned spring rate of the material selected for the clip does not remain constant throughout the manufacturing process. Several factors contribute to variations in the spring rate including: variations in raw material sizing; variations in post process steps; and differences in elemental compounds that are used to form alloys of the material used for the clip. Because the objective of using a clip is to apply a load on the heat sink and the component such that heat is efficiently transferred from the component to the heat sink. As a result of the aforementioned variations, there are variations in a load characteristic of clips produced from different batches of raw materials and/or by different processing steps.

Third, another property of the clip that is directly related to the spring rate is a spring back property. If a clip is made from a material with a high spring back property, then it is more difficult to form and achieve a required profile in the clip as the tools used for forming those profiles require a substantial amount of spring back compensation. Another consequence of the high spring back property is that it makes it difficult to achieve a desired dimensional accuracy in the clip.

Fourth, a load center of the clip depends on accurate dimensions for each arm of the clip. However, due to the above mentioned spring back property, there will be variations in the arm lengths that result in the load center being offset from an ideal position. Consequently, the load center will not act on the required point with a resulting increase in a contact resistance between the heat sink and the component. The higher the contact resistance results in less efficient heat removal of waste heat from the component by the heat sink.

Fifth, to compensate for the spring back property associated with the material selected for the clip, in some cases, a soft material is selected for the forming process. After forming, the soft material is heat treated to harden the material. However, the material deforms during the heat treatment process and causes the load center to shift with the same results as described above.

Sixth, another disadvantage of prior clips is that they are difficult to install and difficult to remove. For instance, to install a prior clip, a latch portion on an arm of the clip must be tilted during insertion followed by pushing the latch portion back to attach the latch portion to a tab or the like on the connector that carries the component. On the other hand, to remove the prior clip, a special tool is usually required to tilt a handle on the clip so that the latch portion disengages from the connector. In some cases, the handle is so small that it is not easy to remove the clip using the special tool and is extremely difficult if not impossible to remove the clip by hand.

Finally, a typical prior clip that is made from a material such as sheet metal, for example, is designed to exert a total load force of about 25 lbs. To exert a higher load force requires either the thickness of the material be increased or the hardness of the material be increased to achieve a higher spring rate that will result in a higher load force. However, increasing the thickness and/or the spring rate of the material makes the material extremely difficult to punch and form and also reduces die life.

Consequently, there is a need for an attachment device that is made from a material that eliminates the aforementioned dependence on spring rate and material hardness, eliminates variations in spring rate due to variations in material properties or variations in processes used to form the material, and that eliminates variations in load characteristics. There exists a need for an attachment device that eliminates dependance on a materials spring back property and the resulting difficulties in manufacturing clip profiles that arise from the spring back property. Additionally, there is also a need for an attachment device that provides for an accurate load center that is free from offset due to the aforementioned variations in the spring back property caused by arm length variations and/or heat treating a soft material. There is a need for an attachment device that is capable of exerting a high total load force without increasing material thickness or material hardness to achieve a higher spring rate commensurate with the high total load force and that achieves the high total load force without reducing die life. Finally, there is a need for an attachment device that is easy to install and remove without the need for special tools and that can be installed or removed by hand.

SUMMARY OF THE INVENTION

The attachment mechanism of the present invention solves the aforementioned problems. The problem associated with the use of punch and formable materials such as steel or Stainless Steel with a low spring rate and a low hardness are solved by using a plate. The plate can be made from a rigid material, such as a metal, for example. The plate can be formed by die casting, injection molding, and stamping, for example.

Furthermore, the problems associated with variations in spring rate and the resulting variations in the load characteristics of the prior spring clips are eliminated by using a rigid material for the plate thereby providing for a consistent load characteristic. The plate is substantially immune to variations in spring rate caused by processing steps applied to the plate during its manufacture. Moreover, the use a latch assembly including a spring for exerting a load force provides for a consistent load force between the cooling device and the component. The load force can be tailored based on spring size and the load force can be selected to easily exceed the 25.0 lbs limit of the prior spring clips.

The attachment mechanism of the present invention also solves the problems associated with the spring back property of prior clips because the use of the plate and the latch assembly eliminates the need to form clip profiles, to achieve dimensional accuracy in those clip profiles, and to provide for spring back compensation in tools used to form the clip profiles. Additionally, the shifting of the load center of prior clips caused by inaccurate spring profiles is also eliminated by using the plate.

The plate solves the problems associated with a load center shift caused by heat treating a prior spring clip made from a soft material. The use of a spring in the latch assembly solves the problems associate with using a thicker material with a higher spring rate to achieve a high load force.

Finally, the difficulties associated with installation and removal of prior clips are solved by the attachment mechanism of the present invention through the use of a hinge and a pivotally mounted latch assembly that allow the attachment mechanism to be installed and removed by hand, and without the need to use special tools to effectuate installation and removal.

Broadly, the present invention is embodied in an attachment mechanism for connecting a cooling device, such as a heat sink or the like, with a component to be cooled. The component is carried by a connector and the attachment mechanism includes a hinge and a pivotally mounted latch assembly that are adapted to be removably connected with the connector.

The attachment mechanism includes a plate having opposed mounting and base surfaces, a bore, a hinge slot, and a latch slot. The bore, the hinge slot, and the latch slot extend through the mounting and base surfaces. The bore is adapted to connect with the cooling device. The attachment mechanism also includes a hinge and a latch assembly that are adapted to be inserted into the hinge slot and the latch slot respectively.

The hinge includes a flange that prevents complete insertion of the hinge into the hinge slot and a hinge portion having an aperture therein. The aperture is adapted to be removably hinged with the connector.

The latch assembly includes a handle portion having a slot therein, a keeper positioned in the slot, a plurality of tilt relief profiles, and a latch portion having a latch profile that is adapted to be removably latched with the connector, a retention aperture formed in the latch portion, and a stop adapted to be inserted into the retention aperture. A spring locator is movably positioned in the slot. The spring locator includes a spring guide extending outward of a spring face and a slot guide extending outward of a slot face, and a spring connected with the keeper and the spring guide and operative to exert a load force between the cooling device and the component.

The latch assembly is positioned in the latch slot with the retention aperture of the latch portion positioned below the base surface, the slot guide positioned in the latch slot, and the slot face in contact with the mounting surface. Because the spring guide is movable in the slot, insertion of the latch assembly urges the keeper towards the spring guide and compresses the spring. The stop is positioned in the retention aperture to maintain the spring in compression and to prevent the latch assembly from being pulled out of the latch slot by a force exerted by the compressed spring such that the latch assembly is retained in the latch slot.

The latch assembly is urged downward into the latch slot to align the tilt relief profiles with the mounting surface and the base surface so that an actuation force applied to the handle portion radially tilts the latch assembly (i.e. radially pivots) within the latch slot to latch and unlatch the latch profile with the connector.

In one embodiment of the present invention, the handle portion of the latch assembly includes a handle that is adapted to be gripped by a hand so that the latch assembly can be easily actuated to latch or unlatch the latch profile from the connector.

In another embodiment of the present invention, the flange on the hinge is in contact with the mounting surface and straddles the hinge slot to prevent complete insertion of the hinge into the hinge slot.

In one embodiment of the present invention, the aperture of the hinge portion includes an aperture profile selected to match a complementary profile on the connector. Similarly, in another embodiment of the present invention, the latch profile is selected to match a complementary profile on the connector.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIGS. 3a and 3b are cross-sectional views of a latch assembly according to the present invention.

FIGS. 4a through 4c are front, side, and profile views respectively of a latch assembly including a handle according to the present invention.

FIGS. 7a through 7d are side, top, and profile views respectively of a spring locator according to the present invention.

FIGS. 8a through 8d are front and side views respectively of a hinge according to the present invention.

FIGS. 9a through 9b depict a hinge inserted into a hinge slot of a plate according to the present invention.

FIGS. 15a through 15d illustrate top, side, and end plan views of a connector.

DETAILED DESCRIPTION

Figure 1:
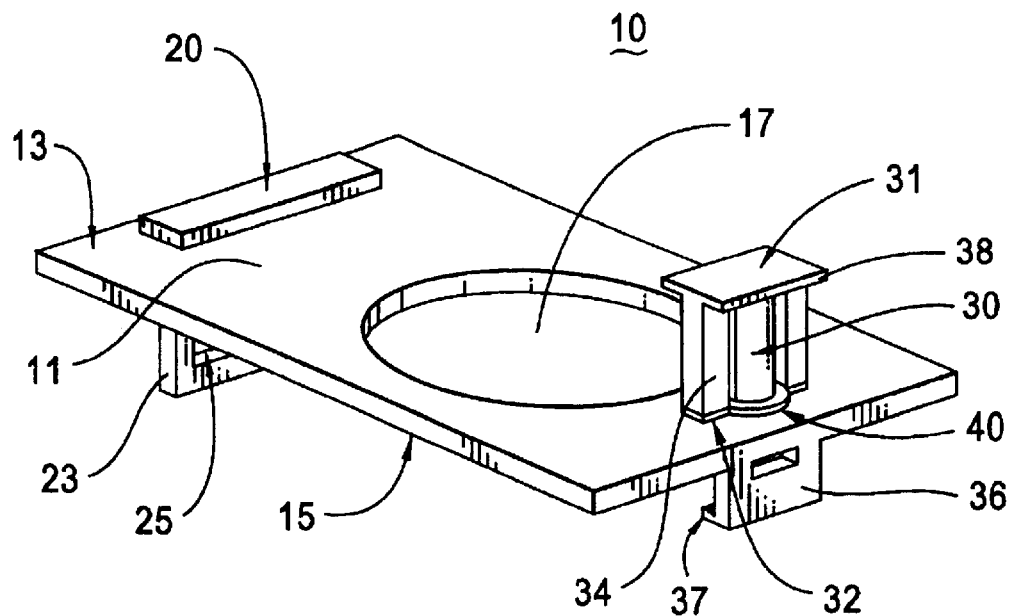
FIG. 1 is a profile view of an attachment mechanism according to the present invention.
Figure 2:
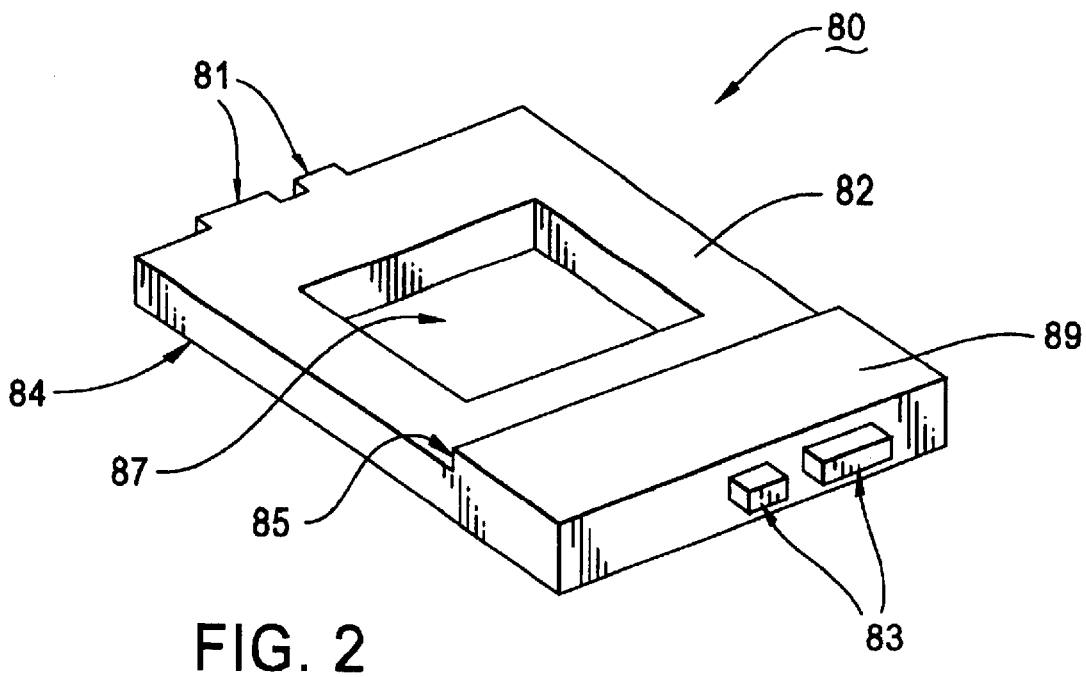
FIG. 2 is a profile view of a connector.
Figures 5A, 5B:
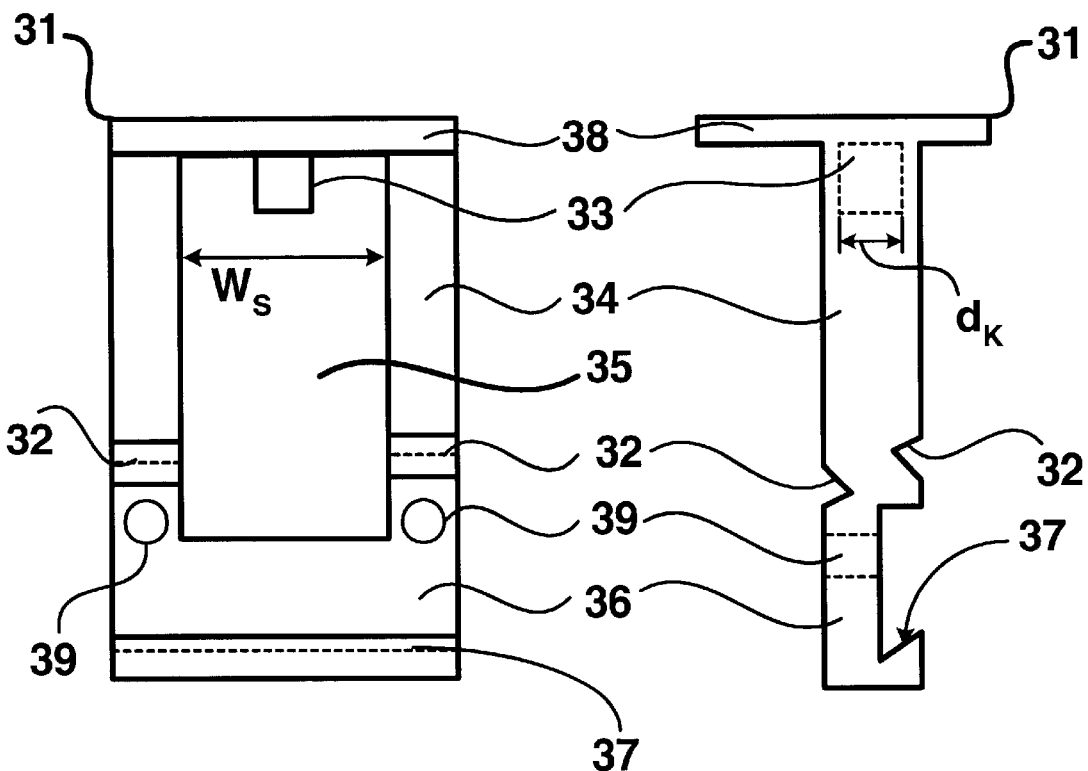
FIGS. 5a through 5b are front and side views respectively of a latch assembly including a handle according to the present invention.

In the following detailed description and in the severals of the drawings, like elements are identified with like reference numerals.

As shown in the drawings for purpose of illustration, the present invention is embodied in an attachment mechanism for connecting a cooling device with a component that is carried by a connector. Contact between the cooling device and the component provides a thermally conductive path for waste heat in the component to be thermally transferred from the component to the cooling device.

The attachment mechanism includes a plate having a mounting surface and a base surface, a bore, a hinge slot, and a latch slot. The bore, the hinge slot, and the latch slot extend through the mounting and base surfaces. The bore is adapted to connect with the cooling device. The attachment mechanism also includes a hinge and a latch assembly that are adapted to be inserted into the hinge slot and the latch slot respectively.

The hinge includes a hinge portion having an aperture therein. The aperture is adapted to be removably hinged with the connector. When the hinge is inserted into the hinge slot the flange is in contact with the mounting surface and prevents complete insertion of the hinge into the hinge slot.

The latch assembly includes: a handle portion having a slot therein; a keeper positioned in the slot; a plurality of tilt relief profiles; a latch portion having a latch profile that is adapted to be removably latched with the connector; a retention aperture formed in the latch portion; a stop adapted to be inserted into the retention aperture; a spring locator that is movably positioned in the slot; and a spring.

The spring locator includes a spring guide extending outward of a spring face and a slot guide extending outward of a slot face. The spring is connected with the keeper and the spring guide and is operative to exert a load force between the cooling device and the component.

The latch assembly is positioned in the latch slot with the retention aperture of the latch portion positioned below the base surface, the slot guide positioned in the latch slot, and the slot face in contact with the mounting surface. Because the spring guide is movable in the slot, insertion of the latch assembly urges the keeper towards the spring guide and compresses the spring. The stop is positioned in the retention aperture to maintain the spring in compression and to prevent the latch assembly from being pulled out of the latch slot by a force exerted by the compressed spring. As a result, the latch assembly is retained in the latch slot with the spring held in compression.

The latch assembly is urged downward into the latch slot to align the tilt relief profiles with the mounting surface and the base surface so that an actuation force applied to the handle portion radially tilts the latch assembly (i.e. radially pivots the latch assembly) within the latch slot so that the latch profile can be latched or unlatched with the connector.

The plate eliminates the aforementioned problems associated with prior spring clips such as spring back, low spring rates, low hardness, and variations in load characteristics. The latch assembly solves the aforementioned problems with spring rate variations and load force limitations by using the spring to provide a consistent spring rate. The load force can be tailored to a specific application by selecting a spring with the appropriate characteristics such as spring length, spring diameter, etc. The latch assembly can be actuated by a hand to latch and unlatch the attachment mechanism from the connector. Accordingly, unlike prior spring clips, tools are not necessary to remove or install the attachment mechanism.

In FIG. 1, an attachment mechanism 10 includes a plate 11 having a mounting surface 13 and a base surface 15, a hinge 20 connected with the plate 10, a latch assembly 31 connected with the plate 11. In FIGS. 10a through 10e, the plate 11 includes a hinge slot 12, a latch slot 14, and a bore 17. The bore 17, the latch slot 14, and the hinge slot 12 extend through the mounting and base surfaces (13, 15) as illustrated in FIGS. 10c and 10e. Preferably, the mounting and base surfaces (13, 15) are positioned in opposition to each other so that they are substantially parallel to each other.

Figure 10A:
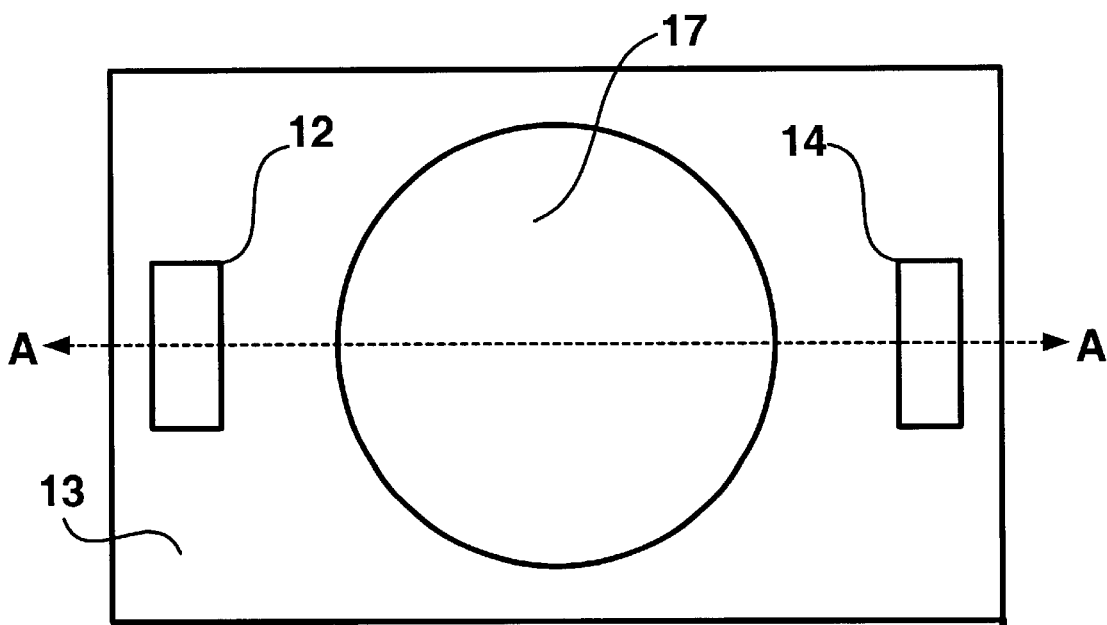
FIGS. 10a through 10e are top views, a side view, a bottom view, and a profile view respectively of a plate according to the present invention.
Figure 10B:
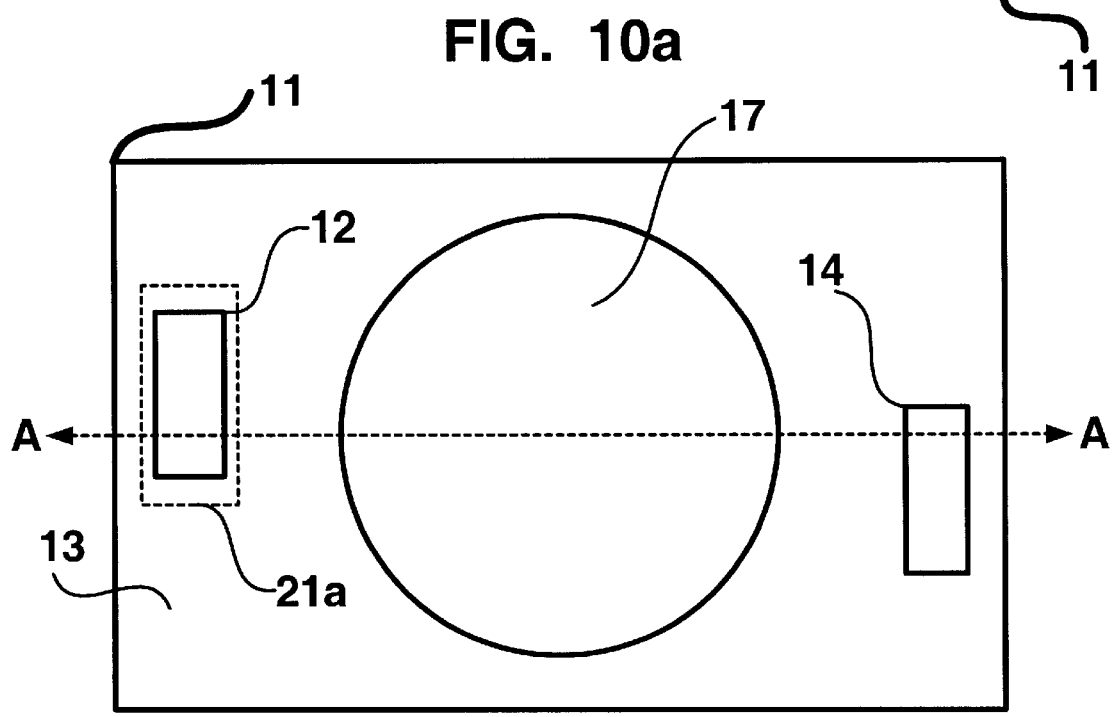
Figure 10C:
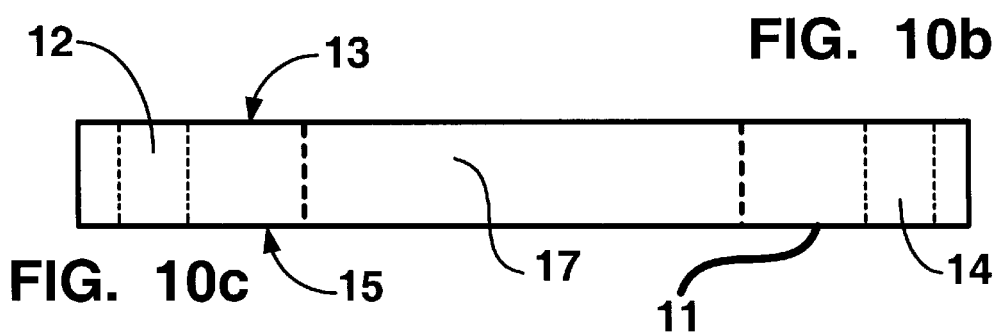
Figure 10D:
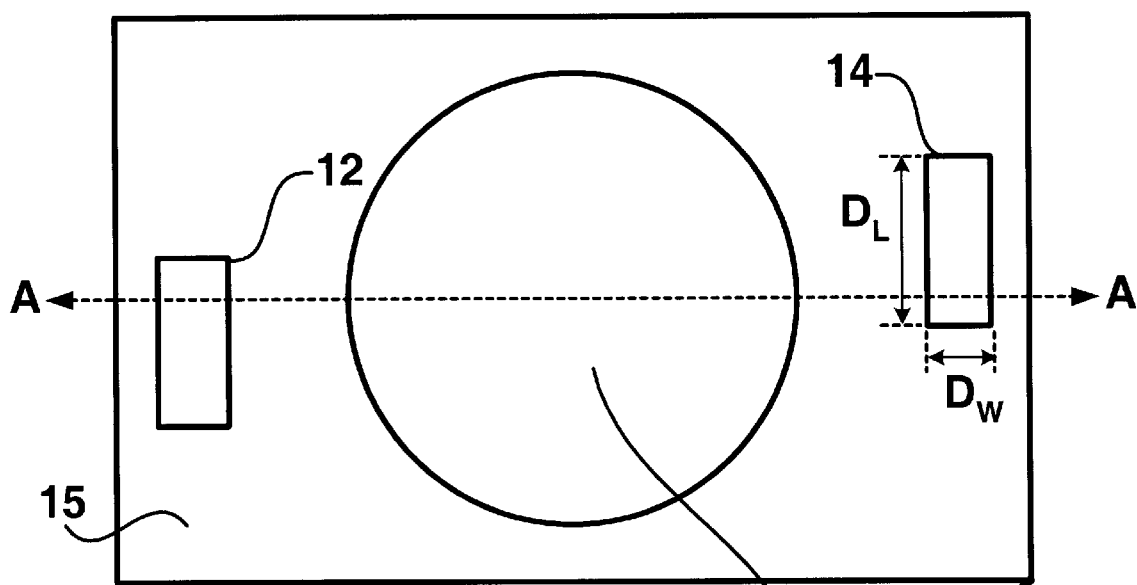
Figure 10E:
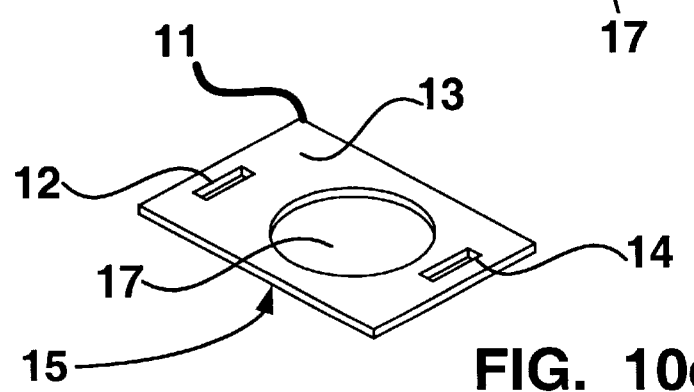

The hinge and latch slots (12, 14) can be positioned on the plate 11 in a symmetrical relation as illustrated in the top plan view of FIG. 10a or in a non-symmetrical relation as illustrated in the top plan view of FIG. 10b, the bottom plan view of FIG. 10d, and the profile view of FIG. 10e. The symmetrical or non-symmetrical relation can be relative to a center line of symmetry AA. However, some other reference point of symmetry can be selected. The center line of symmetry AA was selected because the plate 11 has a rectangular shape. The plate 11 can have any shape and the plate 11 is not to be construed as being limited to the rectangular shape illustrated herein.

The plate 11 can be made from a variety of materials including but not limited to a metal, a metal alloy, a plastic, a composite material, and a ceramic material. Preferably, the plate 11 is made from a rigid material such as a metal or a metal alloy. For example, the plate 11 can be made from aluminum (Al), steel, alloys of aluminum or steel, or a strong resin like Polycarbonate or Altem. The choice of material for the plate 11 will be application dependent. Metal is a good choice because metal can be rigid. Additionally, a low cost metal such as aluminum can be used for the plate 11 as opposed to higher cost metals such as steel or Stainless Steel. A manufacturing process such as punching, die casting, stamping, and machining can be used to form the plate 11. A material such as plastic, for example, can be injection molded or machined to form the plate 11.

Figure 12:
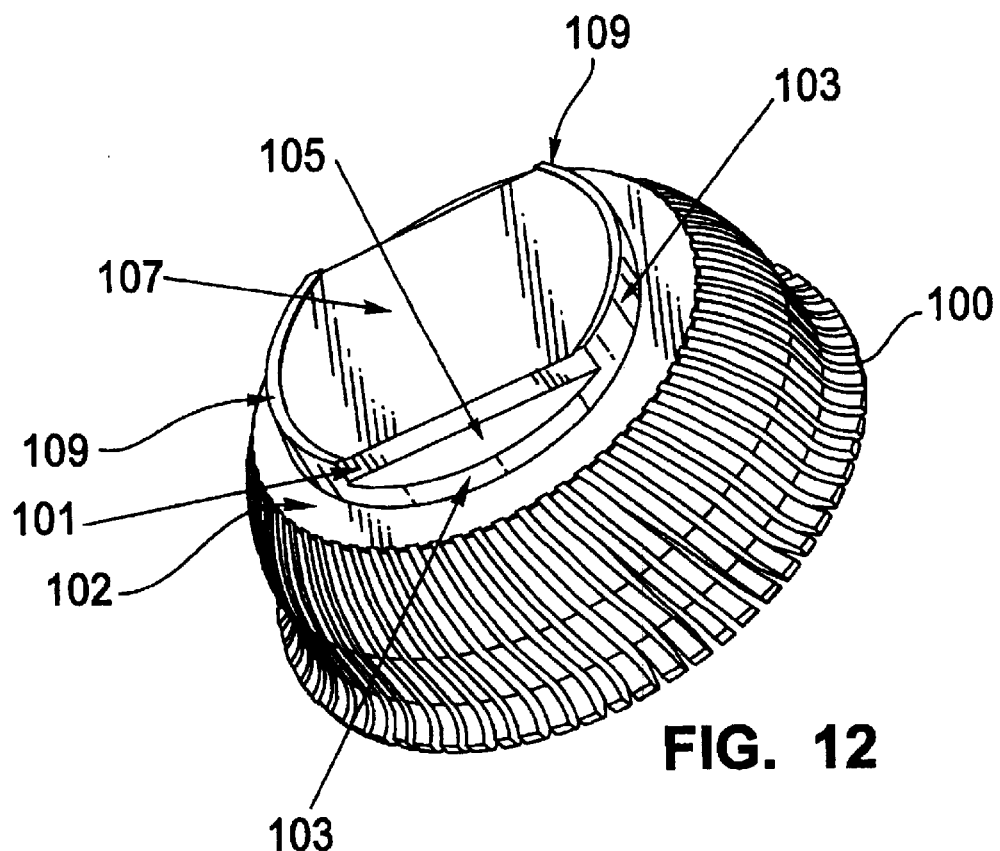
FIG. 12 is a profile view of a base portion of a cooling device.
Figure 13:
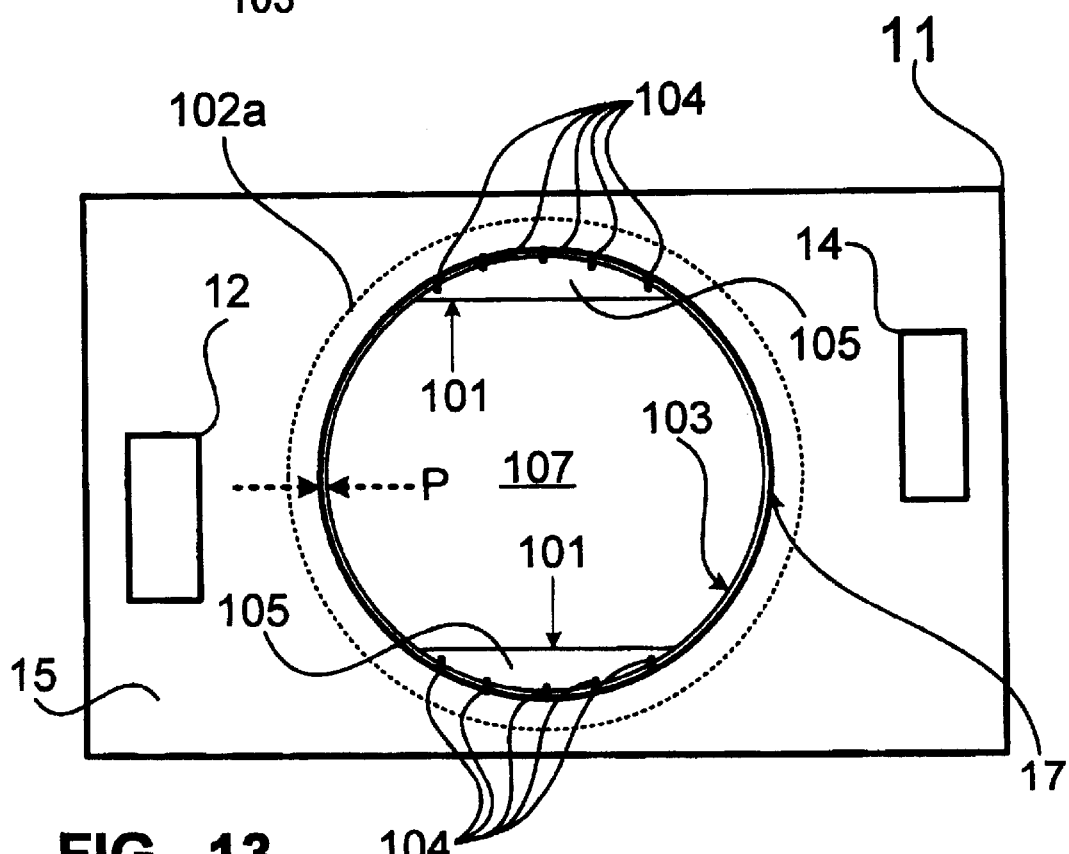
FIG. 13 is a bottom plan view of the base portion of FIG. 12 fixedly connected with a bore of a plate according to the present invention.

The bore 17 is adapted to connect with a cooling device. The bore 17 need only connect with a portion of the cooling device. For example, in FIGS. 12 and 13, a cooling device 100 includes a cylindrical base 103 that extends outward of a bottom portion 102. The base 103 includes a pair of opposed flats 101, a contact surface 107 that connects with the component to be cooled (not shown), and a plateau 105 that is positioned below the contact surface 107. The base 103 is inserted in the bore 17 (also cylindrical in shape) so that the base 103 is in contact with the bore 17. Preferably, after insertion of the base 103 into the bore 17, the bottom portion 102 is in contact with the mounting surface 13 (see dashed circle 102a in the bottom plan view of FIG. 13).

Preferably the cooling device 100 is fixedly connected with the plate 11 by a press fit between the bore 17 and the base 103 as indicated by dashed arrow P. The press fit P can be achieved by selecting an inside diameter of the bore 17 and an outside diameter of the base 103. For instance, a H7 tolerance on the inside diameter of the bore 17 and a p6 tolerance on outside diameter of the base 103 can be selected to effectuate the press fit P.

For example, a 40H7 tolerance on the bore 17 means the bore 17 should be machined within 40.00 mm to 40.02 mm. Similarly, a 40p6 tolerance on the outside diameter of the base 103 means that the outside diameter of the base 103 should be machined within 40.02 mm to 40.04 mm. Hence, the 40H7 tolerance and the 40p6 tolerance will provide an interference location fit between the bore 17 and the outside diameter of the base 103.

In one embodiment of the present invention, manufacturing variations between the bore 17 and the base 103 that can defeat the press fit P are overcome by crimping the base 103. The crimping process expands a surface 104 of the plateau 105 so that material on the plateau 105 flows onto the base surface 15 to fixedly connect the cooling device 100 with the plate 11. The crimping 104 and the press fit P may be used together to insure that the cooling device 100 is retained on the plate 11.

Optionally, the cooling device 100 can include guards 109 that extend outward of the contact surface 107. As is well understood in the heat sink art, a thermal interface material (TIM) (not shown) can be positioned between the guards 109 on the contact surface 107. The TIM is positioned between the contact surface 107 and the component to be cooled. The TIM seals voids, air gaps, and the like on the contact surface 107 and the component. The TIM can improve thermal conductivity to enhance heat transfer from the component to the cooling device 100. A material such as a thermally conductive paste, grease, film, or the like can be used for the TIM.

In FIGS. 8a through 8d, a hinge 20 includes a flange 21 and a hinge portion 23. The hinge portion 23 includes at least one aperture 25 formed therein (two are shown) and extending through the hinge portion 23. The aperture 25 can be any shape and if more than one aperture is used, the apertures 25 need not have the same shape or have identical dimensions. The flange 21 can extend outward of the hinge 20 in one or more directions as illustrated in FIGS. 8b and 8d. The flange 21 needs to extend outward of the hinge 20 by an amount sufficient to prevent complete insertion of the hinge 20 into the hinge slot 12.

The hinge 20 can be made from a wide variety of materials including but not limited to a metal, a metal alloy, a plastic, a composite material, and a ceramic material. For example, the hinge 20 can be made from aluminum (Al), steel, alloys of aluminum or steel, or a strong resin like Polycarbonate or Altem. The hinge 20 can be made by a process including but not limited to machining, diecasting, metal forming, and injection molding. For low cost and ease of manufacturing, plastic is a preferred material.

In FIGS. 9a and 9b, the hinge 20 is shown inserted into the hinge slot 12 of the plate 11 with the hinge portion 23 extending outward of the base surface 15 so that the aperture 25 is below the base surface 15 and the flange 21 is in contact with the mounting surface 13. In FIG. 9b, the flange 21 straddles the hinge slot 12 to prevent complete insertion of the hinge 20 into the hinge slot 12. In FIG. 9a, the flange 21 is of sufficient size to prevent complete insertion of the hinge 20 into the hinge slot 12. The flange 21 can straddle the hinge slot 12 on all sides as illustrated by a dashed outline of the flange (see reference numeral 21a) in a top plan view of the plate 11 in FIG. 10b.

Preferably, the hinge 20 is retained in the hinge slot 12 by a press fit (see dashed arrows P in FIGS. 9a and 9b) between the hinge slot 12 and the hinge 20. The press fit P can be achieved by selecting the outside dimensions of the hinge 20 to be slightly larger than the inside dimensions of the hinge slot 12 so that upon insertion of the hinge 20 into the hinge slot 12, a tight fit is obtained between the hinge slot 12 and the hinge 20 and that tight fit retains the hinge 20 in the hinge slot 12. The press fit P can be easily accomplished by using a plastic material for the hinge 20. The press fit P can also be accomplished using the above mentioned interference location fit. For example, a size of the hinge 20 in a X and Y direction is kept from about 0.01 mm to about 0.02 mm more than the a size of the hinge slot 12 in a X and Y direction.

The hinge 20 and the hinge slot 12 can have any shape and are not to be construed as being limited to the rectangular shapes illustrated herein. For instance, the hinge slot 12 can have an oval shape and the hinge 20 can have a complementary oval shape that is selected to allow for insertion and retention of the hinge 20 into the hinge slot 12.

Similarly, the aperture 25 can have an aperture profile selected to match a complementary profile on the connector 80. For example, in FIGS. 8c and 8d, the rectangular aperture profile of the aperture 25 can be selected to match a complementary profile on a connector 80 in FIGS. 15a through 15d. Typically, the connector 80 will include a hinge tab 81 and the hinge tab 81 will have a profile that complements the profile of the aperture 25. The complementary profile of the hinge tab 81 need not exactly match the aperture profile of the aperture 25. Therefore, the rectangular aperture profile of the aperture 25 can be complemented by a partially rectangular profile that includes some arcuate portions (see FIGS. 15b and 15d) that facilitate hinging and unhinging the hinge 20 from the hinge tab 81. As another example, if the aperture profile of the aperture 25 is circular, then the hinge tab 81 can have a complementary circular profile.

In FIGS. 3a and 3b and in FIGS. 4a through 4c, a latch assembly 31 includes a handle portion 34 having a slot 35 formed therein and a keeper 33 positioned in the slot 35. The handle portion 34 includes a plurality of tilt relief profiles 32. Preferably, the tilt relief profiles 32 are on opposing sides of the handle portion 34. The latch assembly 31 further includes a latch portion 36. The latch portion 36 includes a latch profile 37, a retention aperture 39, and a stop 51 adapted to be inserted into the retention aperture 39 (see FIGS. 6a and 6b). Preferably, a handle 38 is connected with the handle portion 31 as illustrated in FIGS. 4a through 4c. The handle 38 allows the latch assembly 31 to be actuated to latch and to unlatch the latch profile 37 with the connector 80 by gripping the handle 38 with a hand (not shown).

The latch profile 37 can be selected to match a complementary profile on the connector 80 as was described above in reference to the aperture 25 of the hinge 20. For example, in FIGS. 3a and 3b, the latch profile 37 has an arcuate profile and a sloped profile respectively. Typically, the connector 80 will include a latch tab 83 and the latch tab 83 will have a profile that complements the latch profile 37. The complementary profile of the latch tab 83 need not exactly match the latch profile 37 (see FIGS. 16 and 21).

In FIGS. 5a and 5b and FIGS. 6a and 6b the stop 51 is inserted (see dashed arrow I) into the retention aperture 39 of the latch portion 36. The stop 51 is operative to retain the latch assembly 31 in the latch slot 14 as will be discussed below. Preferably, the retention aperture 39 extends through the latch portion 36 so that the stop 51 can be inserted through the retention aperture 39 and extend outward of both sides of the retention aperture 39. After insertion, the stop 51 should have an length L that is longer than the a dimension $D_W$ or and/or a dimension $D_L$ of the latch slot 14 (see FIG. 10d) so that the latch assembly 31 can't be pulled out of the latch slot 14. Although the retention aperture 39 is illustrated as having a circular shape, the retention aperture 39 can have any shape and the stop 51 can have a shape that complements the shape of the retention aperture 39. For example, the retention aperture 39 can be threaded to receive a threaded stop 51 or the retention aperture 39 can have a smooth surface and the stop 51 can be retained in the retention aperture 39 using a press fit, a friction fit, a weld, a glue, or an adhesive.

The stop 51 can be a fastener including but not limited to a screw, a pin, a cotter pin, a dowel, a bolt, a nut and bolt, and a rivet. The latch assembly 31 can be made from a material including but not limited to a metal, a metal alloy, a plastic, a composite, and a ceramic. For example, latch assembly 31 can be made from aluminum (Al), steel, alloys of aluminum or steel, or a strong resin like Polycarbonate or Altem. The latch assembly 31 can be made by a process including but not limited to machining, diecasting, metal forming, and injection molding. For low cost and ease of manufacturing, plastic is a preferred material.

In FIGS. 7a through 7d, the latch assembly 31 further includes a spring locator 40. The spring locator 40 includes a spring guide 45 extending outward of a spring face 41 and a slot guide 47 extending outward of a slot face 43. The spring face 41 and the slot face 43 can be positioned in opposition to each other. For example, the spring face 41 and the slot face 43 can be opposite sides of a disc. The spring locator 40 can include opposed slot engaging portions 42 that are substantially parallel to each other and spaced apart by a distance $d_1$ that is less than a distance $W_S$ across the slot 35 (see FIG. 5a). The slot engaging portions 42 can be flats formed on a curved surface 44 of a disc as illustrated in FIGS. 7c and 7d. The slot engaging portions 42 fit within the slot 35 and allow the spring locator 40 to move up and down (see arrow M of FIG. 6a) within the slot 35.

Figures 6A, 6B:
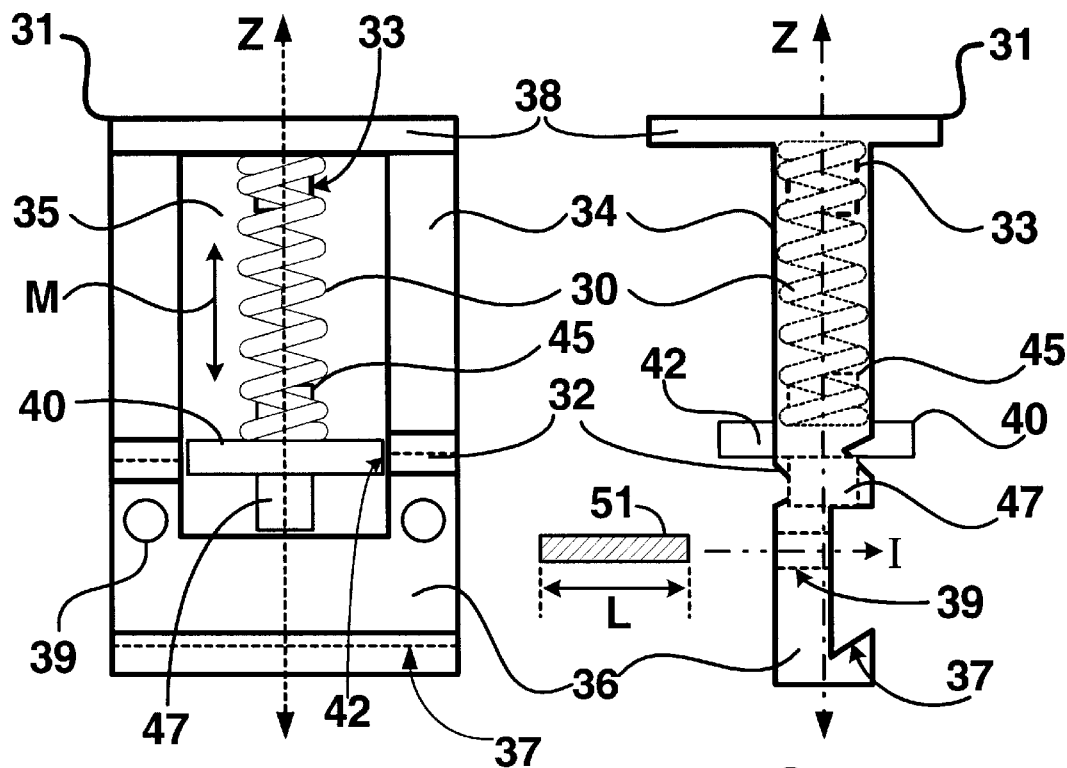
FIGS. 6a through 6b are front and side views respectively of the latch assembly of FIGS. 5a through 5b including a spring locator, a spring, and a stop according to the present invention.

The latch assembly 31 also includes a spring 30 that is connected with the keeper 33 and the spring guide 45 (see FIGS. 6a and 6b). The spring 30 can be a coil spring, a leaf spring, a compressible rubber material, or a compressible polyurethane material. Preferably, the spring 30 is a coil spring. If a coil spring is used for the spring 30, then the keeper 33 and the spring guide 45 can have their respective outside dimensions of $d_K$ and $d_S$ (see FIGS. 5b and 7c), selected to fit within an inside diameter $Id_S$ of opposing ends 30a and 30b of the spring 30 (see FIG. 11a and FIGS. 6a and 6b). Preferably, the outside dimensions ($d_K$, $d_S$) are selected so that the keeper 33 and the spring guide 45 can be completely inserted into the inside diameter $Id_S$ of the spring 30 so that the handle portion 34 and the spring face 41 are in contact with one of the opposed ends (30a, 30b) of the spring 30 (see FIG. 6a).

The latch assembly 31 is positioned in the latch slot 14 with the retention aperture 39 positioned below the base surface 15 of the plate 11 and with the slot guide 47 positioned in the latch slot 14. A dimension $d_L$ of the slot guide 47 is selected to be less than the dimension $D_W$ of the latch slot 14 so that upon insertion into the latch slot 14, the slot face 43 is in contact with the mounting surface and the slot guide 47 substantially aligns itself with the latch slot 14 so that a spring axis Z (see FIGS. 6a, 6b, and 17) is established with respect to the latch assembly 31 and the latch slot 14. Preferably, the spring axis Z is substantially perpendicular to the mounting and base surfaces (13, 15).

Figure 17:
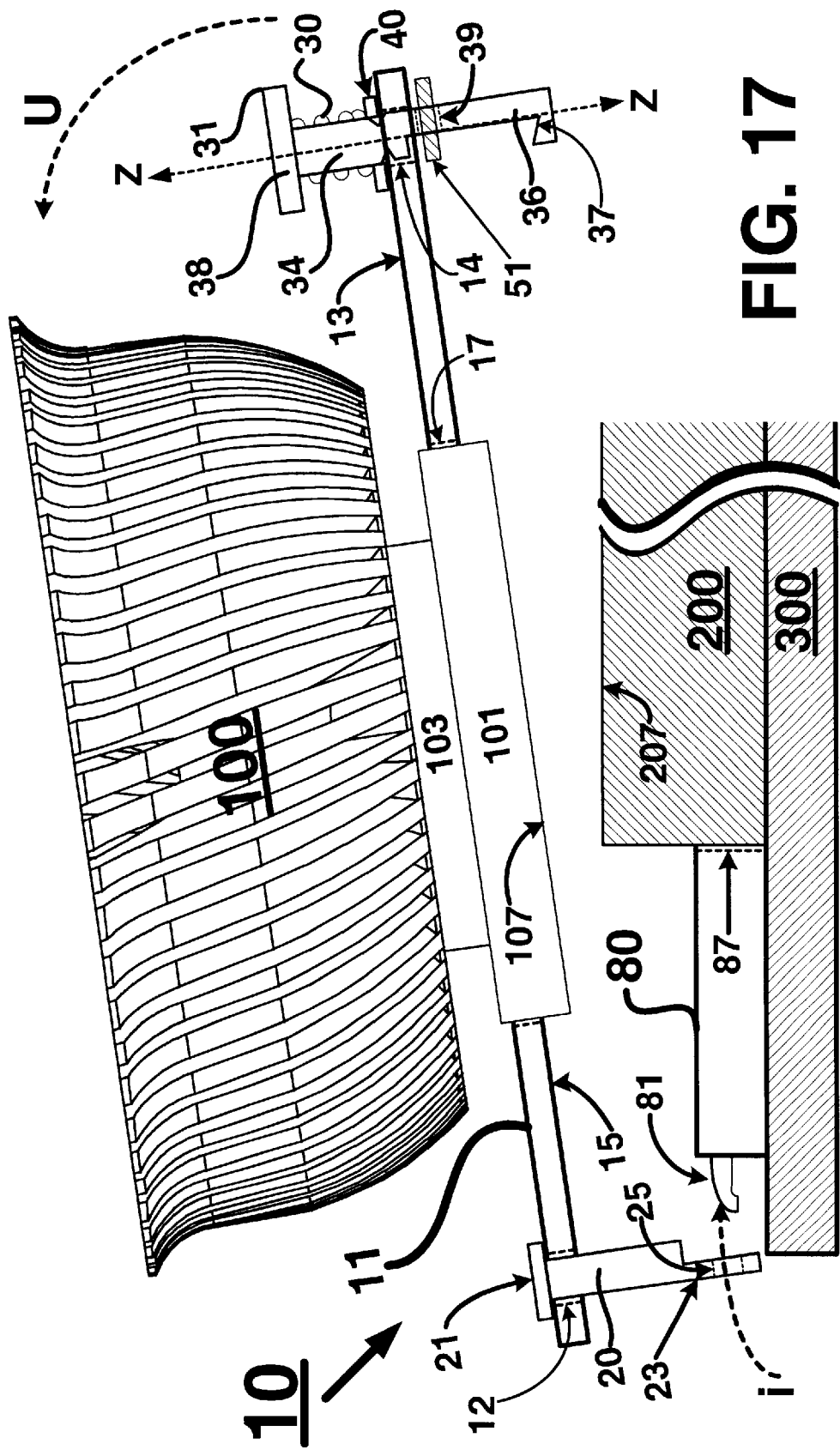
FIGS. 17 and 18 depict hinging an aperture of a hinge with a connector according to the present invention.

Insertion of the latch assembly 31 causes the spring locator 40 to move upward M in the slot 35 thereby urging the keeper 33 towards the spring guide 45. As a result, the spring 30 is compressed. Because the spring 30 is compressed, the stop 51 must be inserted into the retention aperture 39 to prevent a force exerted by the compressed spring 30 from forcing the latch assembly 31 out of the latch slot 14. In FIG. 17, the stop 51 is inserted in the retention aperture 39, is in contact with the base surface 15, and spans across the latch slot 14 to retain the latch assembly 31 in the latch slot 14. Furthermore, the stop 51 retains the spring 30 in a compressed state.

In FIG. 1, the plate 11 of the attachment mechanism 10 is illustrated with the hinge 20 and the latch assembly 31 already inserted into their respective hinge and latch slots (12, 14). Next, the cooling device 100 is connected with the bore 17 as was described above in reference to FIGS. 12 and 13.

Figure 18:
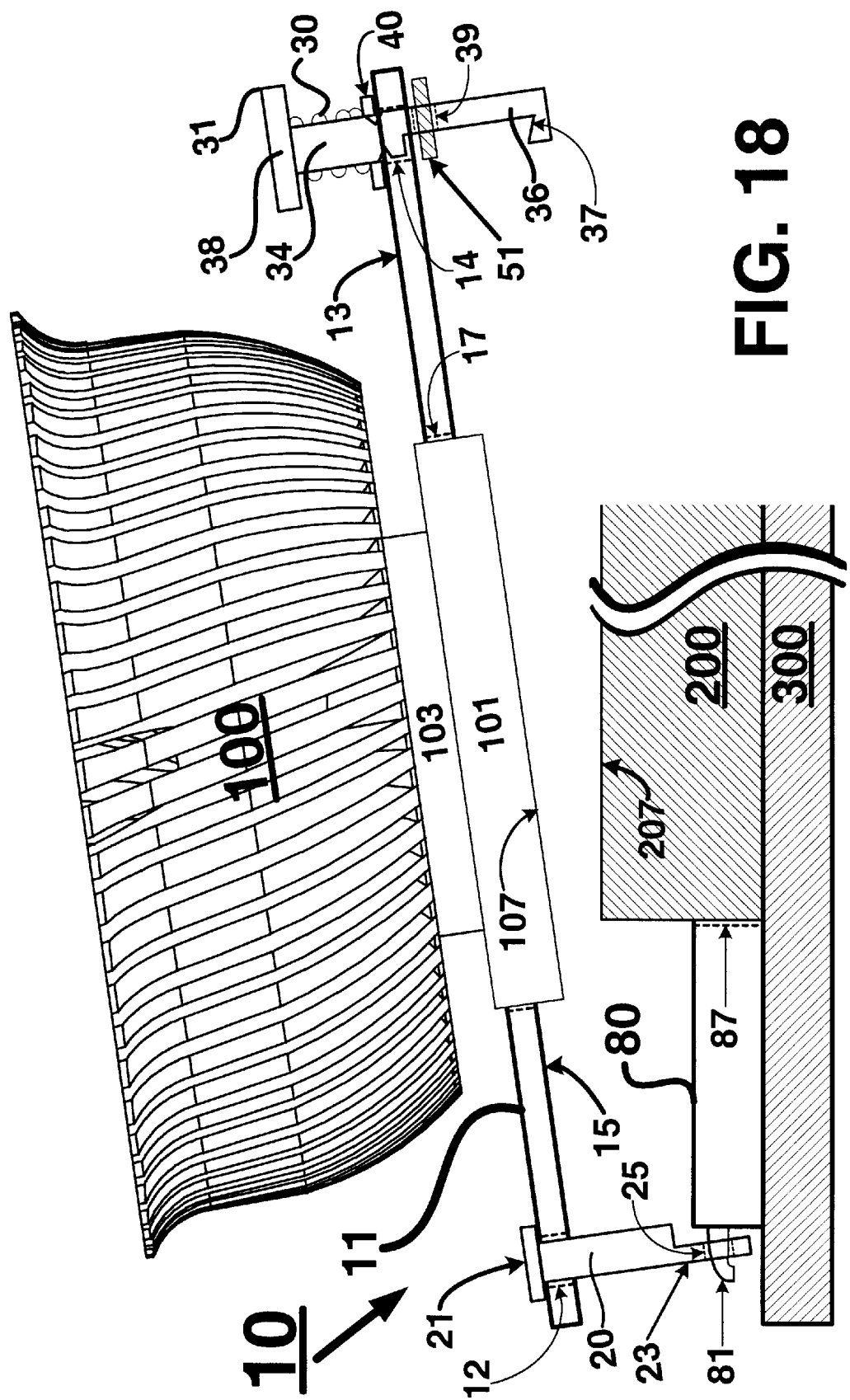

In FIG. 17, the attachment mechanism 10 is depicted with the cooling device 100 connected with the bore 17 and a component 200 is carried by the connector 80. Typically, the connector 80 is mounted to a substrate 300, such as a PC board or the like. The connector 80 includes an opening 87 through which the component 200 is electrically connected with the substrate 300. The steps for hinging the hinge aperture 25 with the connector 80 include rotating the attachment mechanism 10 upward (see dashed arrow U) relative to the connector 80 and then aligning the aperture 25 with a hinge tab 81 on the connector 80 so that the aperture 25 can be inserted (see dashed arrow i) over the hinge tab 81. In FIG. 18, the hinge tab 81 is depicted inserted through the aperture 25 of the hinge portion 23.

Figure 19:
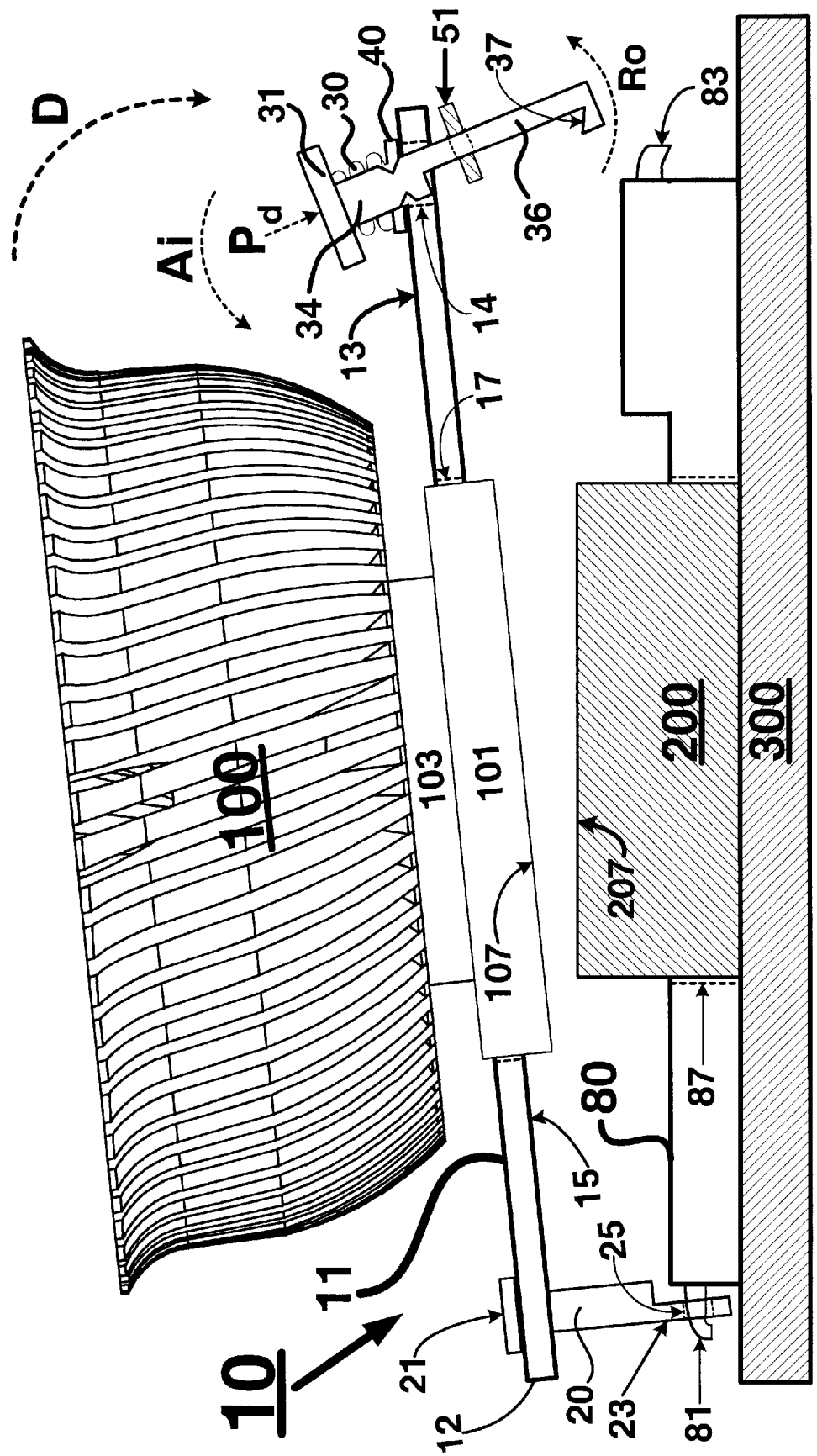
FIGS. 19 through 21 depict actuating a latch assembly to latch a latch profile with a connector according to the present invention.

In FIG. 19, the steps of latching the latching profile 37 on the latch tab 83 of the connector 80 includes pressing the latch assembly 31 down (see dashed arrow $P_d$) into the latch slot 14 to further compress the spring 30 and to align the tilt relief profiles 32 with the mounting and base surfaces (13, 15) (as will be described in greater detail below in reference to FIGS. 14a and 14b) and applying an actuation force in an inward direction (see dashed arrow $A_i$) to pivotally rotate the handle portion 34 inward while rotating the latch portion 36 outward (see dashed arrow $R_o$) so that the latch profile 37 will clear the latch tab 83. The attachment mechanism 10 is then rotated in a downward direction (see dashed arrow D)

to bring the latch profile 37 into position to be connected with the latch tab 83.

Figure 20:
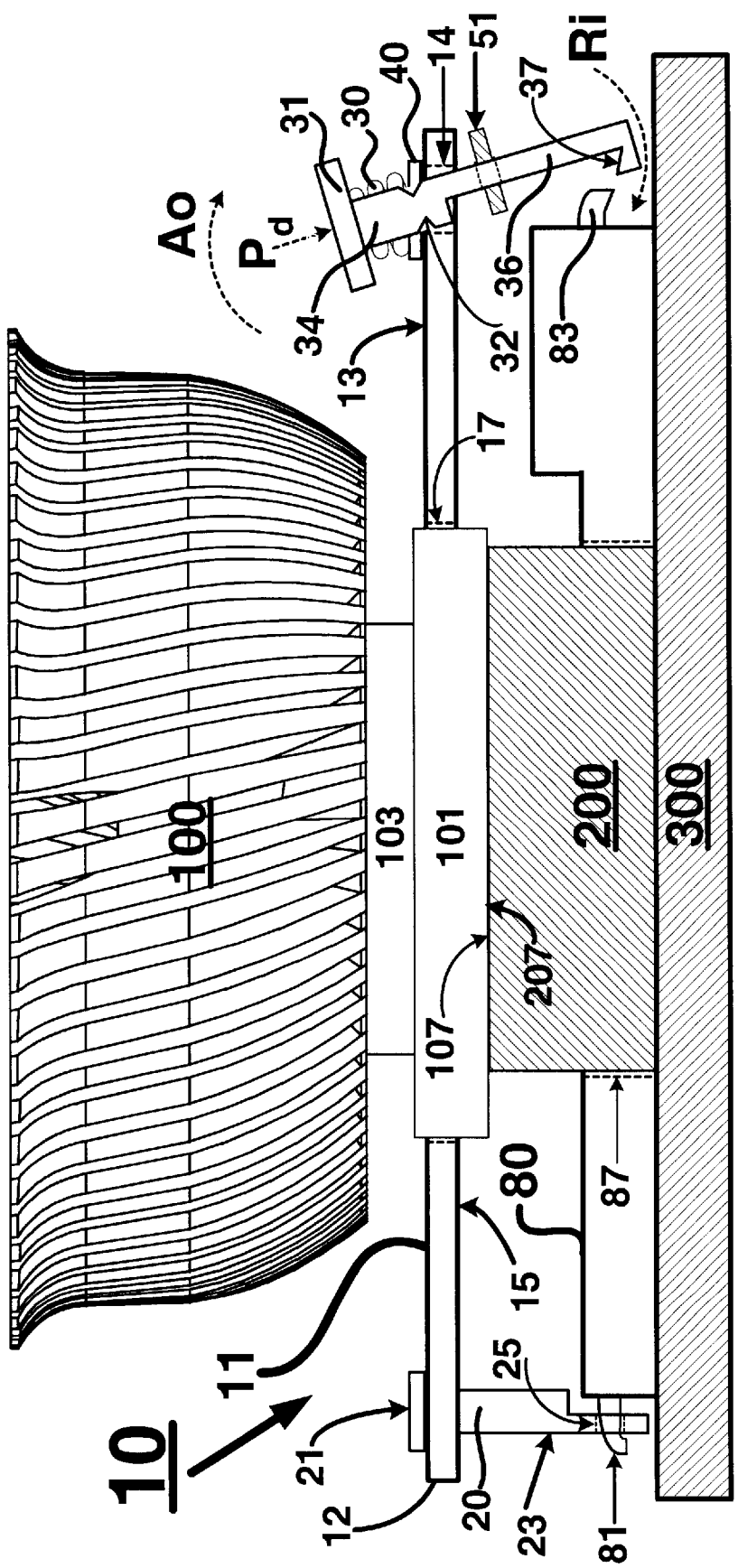

In FIG. 20, the attachment mechanism 10 is positioned relative to the connector 80 to effectuate connection (i.e. latching) of the latch profile 37 with the latch tab 83. With the latch profile 37 in position to be latched, the downward pressure $P_d$ on the latch assembly 31 is maintained in order to keep the tilt relief profiles 32 aligned with the mounting and base surfaces (13, 15) while the handle portion 34 is actuated in an outward direction (see dashed arrow $A_o$) to rotate the latch portion 36 in an inward direction (see dashed arrow $R_i$) to latch the latch profile 37 with the latch tab 83.

Figure 21:
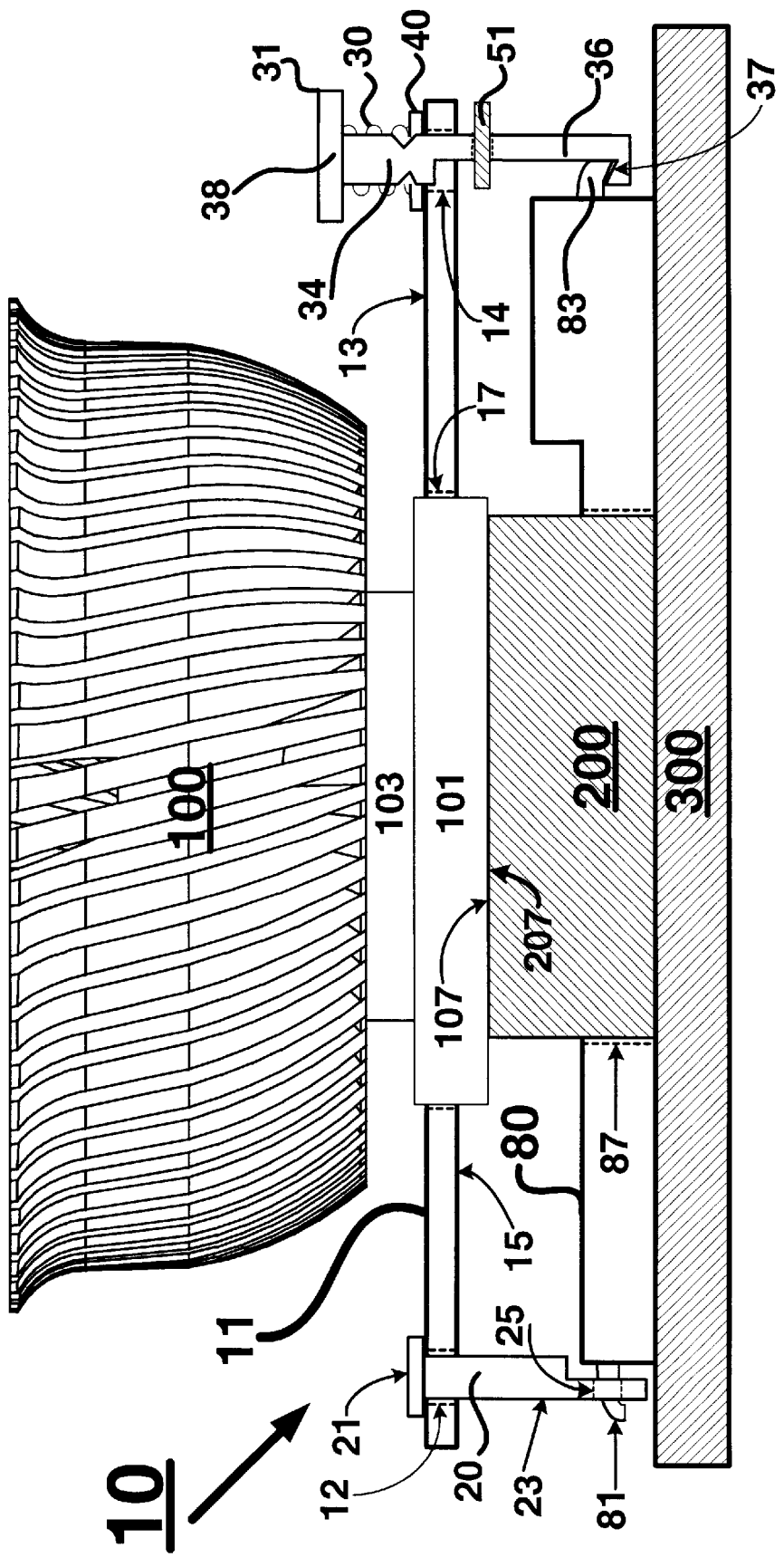

Consequently, in FIG. 21, the attachment mechanism 10 is hinged and latch onto the connector 80 with the cooling device 100 in contact with the component 200. Only a portion of the cooling device 100 need be in contact with a portion of the component 200 as shown in FIG. 21 where the contact surface 107 of the base 103 of the cooling device is in contact with a portion of a surface 207 of the component 200.

To enhance thermal communication between the cooling device 100 and the component 200 and/or to seal micro voids or cracks on the surfaces (107, 207) a thermal interface material (TIM) as discussed above can be positioned intermediate between the surfaces (107, 207). The base 103 can include the guards 109 (see FIG. 12) that extend outward of the contact surface 107. The TIM can be positioned on either one or both of the surfaces (107, 207) prior to latching the attachment mechanism 10 with the connector 80.

Figure 16:
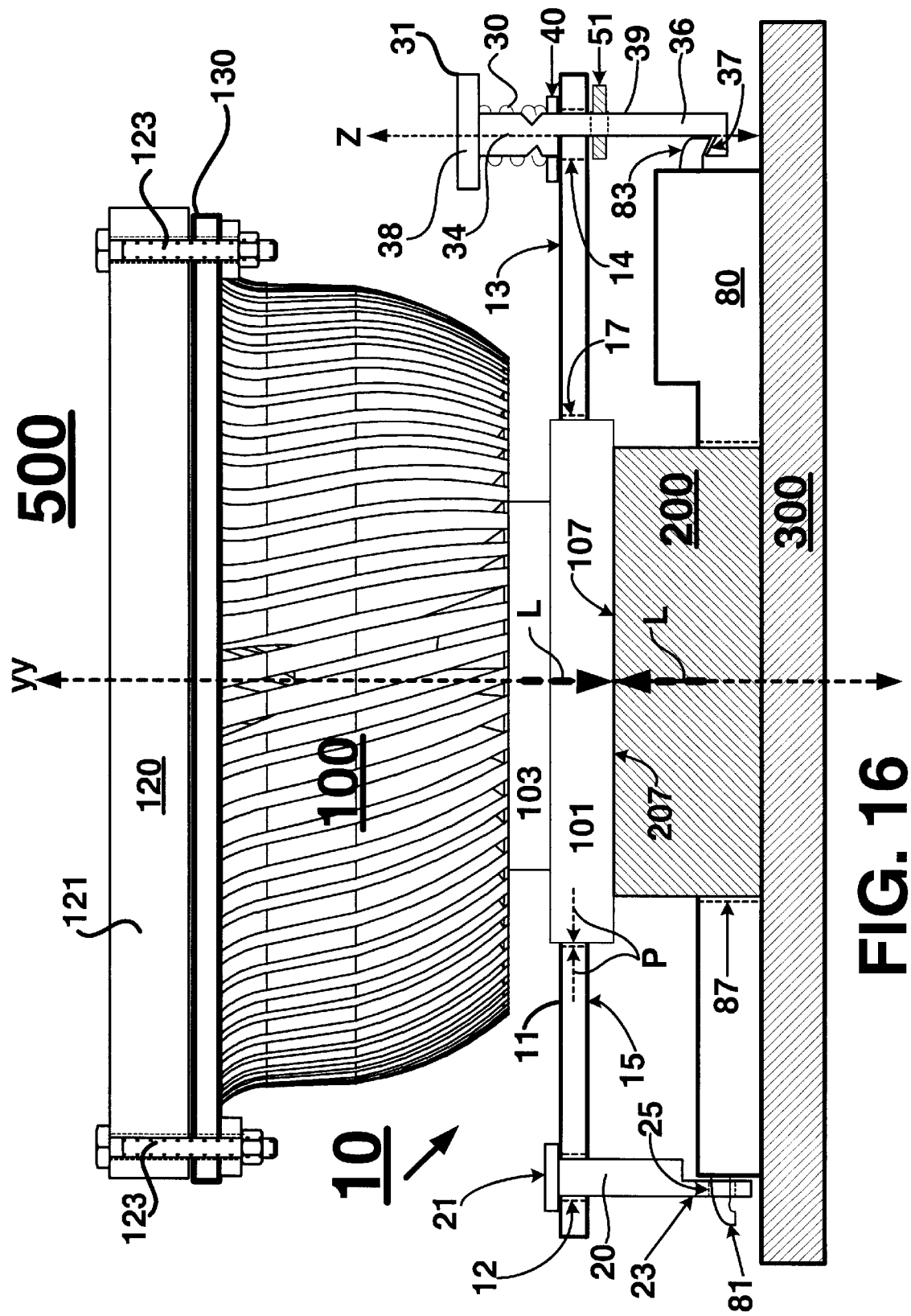
FIG. 16 is a side view of an attachment mechanism connected with a connector carrying a component according to the present invention.

In FIG. 16, after the attachment mechanism 10 is latched onto the connector 80 by latching the latch profile 37 with the latch tab 87, the spring 30 is further compressed so that spring 30 exerts a load force L between the cooling device 100 and the component 200 as indicated by dashed arrow L. That is, the spring 30 is compressed beyond the pre-compression of the spring 30 due to insertion of the latch assembly 31 into the latch slot 14 as was discussed above in reference to FIGS. 17 and 18. A magnitude of the load force L is determined primarily by the characteristics of the spring 30. Those characteristics include a free length $L_S$ (see FIG. 11*b*), the material selected for the spring 30, and the operating space available in the slot 35 of the handle portion 34. One advantage of the attachment mechanism 10 of the present invention over prior spring clips is that the load force L can be greater than 25.0 lbs. The load force L can also be tailored to be less than 25.0 lbs. For instance, for a Pentium® III processor the load force L can be from about 15.0 lbs to about 18.0 lbs and for a Pentium® 4 processor the load force L can be from about 18.0 lbs to about 22.0 lbs.

Figures 11A, 11B:
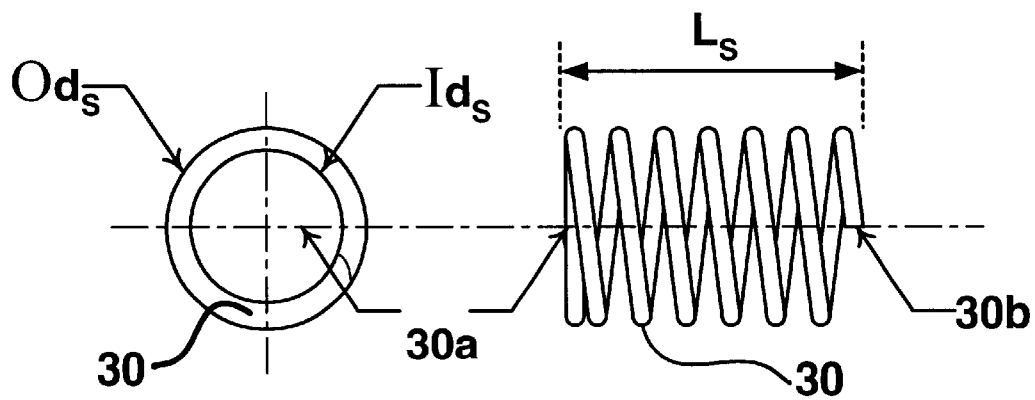
FIGS. 11a through 11b are top and side views respectively of a coil spring according to the present invention.

For example, in FIGS. 11*a* and 11*b*, if the spring 30 has an outside diameter $Od_S$ of 8.0 millimeters, and the free length $L_S$ is 18.0 millimeters, and if the spring 30 is pre-compressed to 15.0 millimeters in the slot 35, then upon latching of the latch profile 37 with the latch tab 83 the spring is further compressed to 13.5 millimeters, the load force L is about 40.0 lbs. A higher load force reduces contact resistance between the cooling device 100 and the component 200 resulting in an increase in thermal efficiency.

Additionally, in FIGS. 19 through 21, the handle 38 can be gripped by a hand of a user (not shown) to push down $P_d$ and actuate ($A_i$, $A_o$) the latch assembly 31. Moreover, unlatching of the latch assembly 31 from the connector 80 is the reverse of the above mentioned latching steps followed by the reverse of the above mentioned hinging steps of FIGS. 17 and 18. The hand of the user can also be used to unlatch the latch assembly 31 from the connector 80. For instance, to unlatch the latch profile 37 from the latch tab 83, the latch assembly 31 is pushed down $P_d$ thereby compressing the spring 30 so that the latch profile 37 is disengaged from the latch tab 83. The handle portion is actuated in an inward direction $A_i$ to pivot the latch portion 36 in an outward direction $R_o$ so that the latch profile 37 clears the latch tab 83.

In FIG. 16, a typical cooling system 500 includes the attachment mechanism 10 latched to the connector 80, the cooling device 100 in contact with the attachment mechanism 10 and the component 200. The cooling device 100 can further include a fan 120 having a fan housing 121 that is connected with the cooling device 100 via a fan retainer 130 using fasteners 123. The fan 120 is connected to a source of power via two or more electrical leads (not shown).

Another advantage of the attachment mechanism 10 of the present invention over the prior spring clips, is that the plate 11 provides a rigid and stable platform for the cooling device 100. Accordingly, the positions of the hinge slot 12, the latch slot 14, and the bore 17 can be preselected to substantially align the load force L with a load center yy of the cooling device 100 and the component 200 when the hinge 20 and the latch assembly 31 are connected with their respective tabs (81, 83) on the connector 80. The alignment between the load force L and the load center yy centers the load force L along the center of the cooling device 100 and the component 200. As a result, contact resistance between the cooling device 100 and the component 200 is reduced.

The shape and dimensions of the connecter 80, as well as the location of the tabs (81, 83), will be application specific. For instance, the tabs (81, 83) need not be positioned on an identical plane as is illustrated in FIG. 16. On the other hand, in FIGS. 15*a* through 15*d*, the tabs (81, 83) can be coplanar as illustrated by line aa in FIG. 15*b*. As was mentioned above, the hinge and latch slots (12, 14) may or may not be symmetrically positioned on the plate 11. In FIGS. 15*a* and 15*c,* the tabs (81, 83) are positioned in a non-symmetrical relation to a line cc through the connector 80. That non-symmetrical relation can determine the non-symmetrical position of the hinge and latch slots (12, 14) on the plate 11. Conversely, if the tabs (81, 83) are positioned in a symmetrical relation to the line cc, then the hinge and latch slots (12, 14) can be positioned in symmetrical relation on the plate 11. The connector 80 can include opposed upper and lower surfaces (82, 84). The upper surface 82 can slope 85 to raised portion 89. Those features of the connector 80 in addition to the placement of the tabs (81, 83) will determine the dimensions of the hinge 20 and the latch assembly 31 so that the aperture 25 and the latch profile 37 will properly mate with their respective tabs (81, 83) on the connector 80. The attachment mechanism 10 can be designed to mate with industry standard connectors such as a PGA 370 or a PGA 462. On the other hand, the attachment mechanism 10 can be designed to mate with a custom designed connector with custom designed tabs.

Figure 14A:
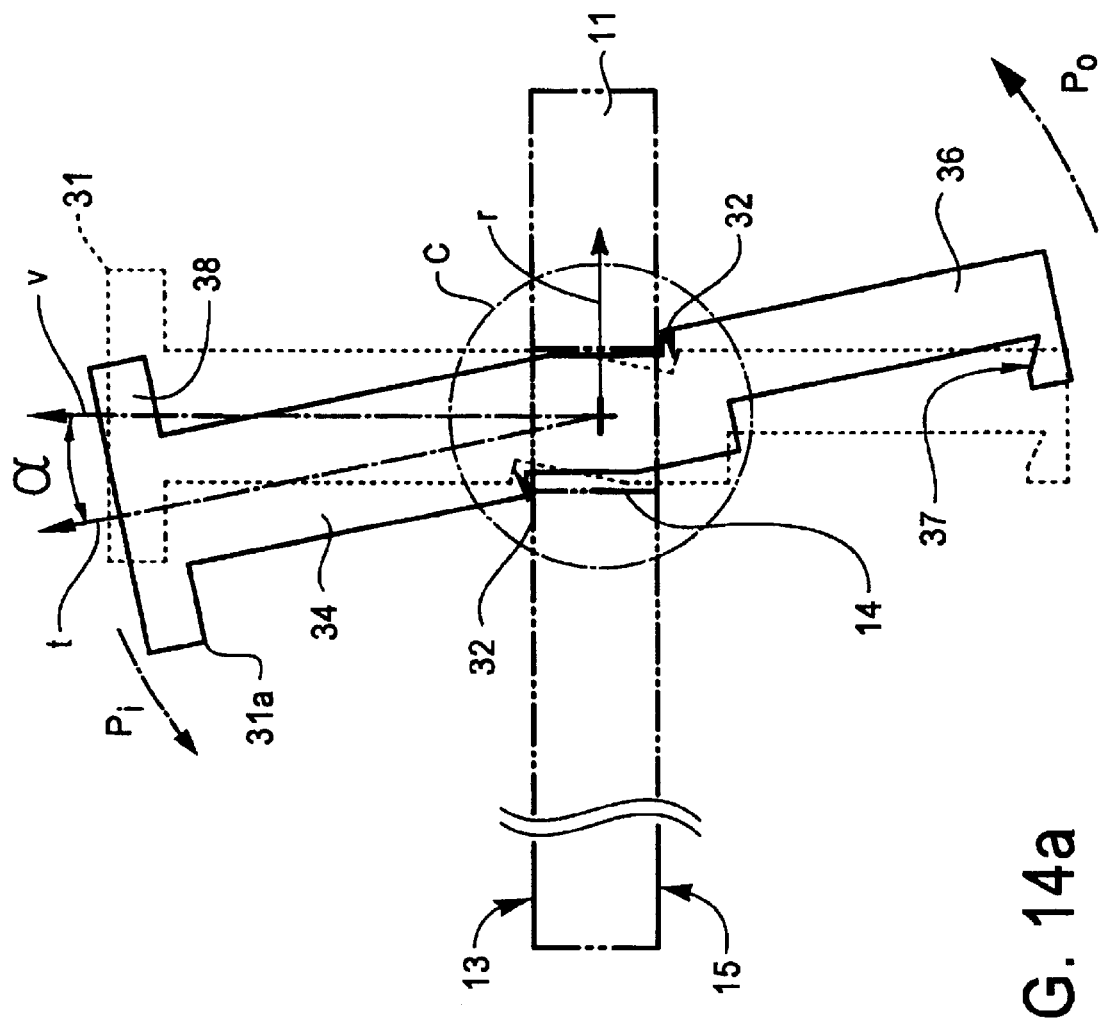
FIGS. 14a and 14b depict radial movement of a latch assembly within a latch slot according to the present invention.
Figure 14B:
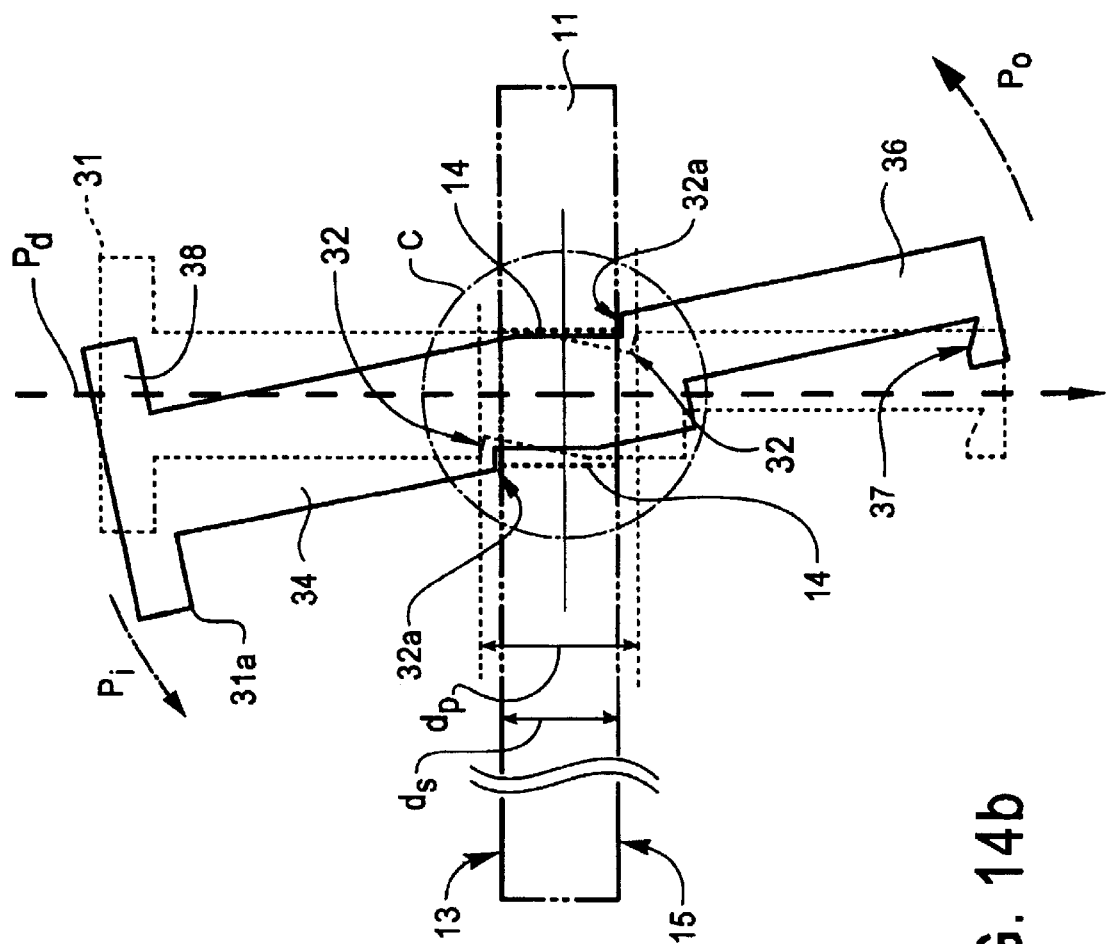

In FIGS. 14*a* and 14*b*, the radial movement (i.e. pivoting) of the latch assembly 31 in the latch slot 14 is illustrated in greater detail. The spring locator 40, the spring 30, and the stop 51 are not shown in order to clearly illustrate the function of the tilt relief profiles 32 in allowing for a range of pivotal motion of the latch assembly 31 in the latch slot 14.

In FIG. 14*a*, the latch assembly 31 (shown in dashed outline) is vertically aligned (see dashed arrow V) in the latch slot 14 and is pushed down $P_d$ so that the tilt relief profiles 32 are aligned with the mounting and base surfaces (13, 15). The alignment of the tilt relief profiles 32 allows the handle portion 34 to be pivoted inward $P_i$ in response to an actuation force (not shown) on the handle portion 34 and/or the handle 38. As the handle portion 34 is pivoted inward $P_i$, the latch portion 36 is pivoted outward $P_o$ in response to the same actuation force. Consequently, the latch assembly 31a (shown in solid outline) has a tilted alignment (see dashed arrow t) relative to the latch slot 14. The difference between the vertical and tilted alignments (V, t) is indicated by an angle α. The angle α can vary over a wide range. For instance, the angle α can be in a range from about 0.0 degrees to about 60.0 degrees. Preferably, the angle α is in a range from about 5.0 degrees to about 45.0 degrees. More preferably, the angle α is in a range from about 10.0 degrees to about 30.0 degrees. With the tilt relief profiles 32 aligned with the mounting and base surfaces (13, 15), the handle portion 34 can rotate along a circle C having a radius r and a center "+" positioned in the latch slot 14.

In FIG. 14b, a dimensional relationship between the tilt relief profiles 32 and the mounting and base surfaces (13, 15) is illustrated. With the handle portion 34 (of the latch assembly 31) in the vertical orientation V and pushed down (see dashed arrow $P_d$) as described above, the tilt relief profiles 32 should be spaced apart by a distance $d_P$ that is greater than a distance $d_S$ between the mounting and base surfaces (13, 15). When the handle portion 34 (of the latch assembly 31a) is pivoted inward $P_i$, the latch relief profiles 32a are positioned proximate the latch slot 14 and the mounting and base surfaces (13, 15).

Although several embodiments of the present invention have been disclosed and illustrated, the invention is not limited to the specific forms or arrangements of parts so described and illustrated. The invention is only limited by the claims.

What is claimed is:

1. An attachment mechanism for connecting a cooling device with a component carried by a connector, comprising:
    a plate including a mounting surface, a base surface, a bore adapted to connect with the cooling device, a latch slot, and a hinge slot;
    a hinge including a flange and a hinge portion having an aperture therein adapted to be removably hinged with the connector, the hinge is positioned in the hinge slot with the flange in contact with the mounting surface; and
    a latch assembly including: a handle portion having a slot therein; a keeper positioned in the slot; and a plurality of tilt relief profiles adapted to facilitate a radial rotation of the latch assembly in the latch slot; a latch portion including a latch profile adapted to be removably latched with the connector; a retention aperture in the latch portion; a stop adapted to be inserted into the retention aperture; a spring locator movably positioned in the slot and including a spring guide extending outward of a spring face and a slot guide extending outward of a slot face; and a spring connected with the keeper and the spring guide and operative to exert a load force between the cooling device and the component,
    the latch assembly is positioned in the latch slot with the retention aperture positioned below the base surface, the slot guide positioned in the latch slot, and the slot face in contact with the mounting surface, wherein insertion of the latch assembly urges the keeper towards the spring guide thereby compressing the spring, and the stop is positioned in the retention aperture to maintain the spring in compression and to retain the latch assembly in the latch slot, and
    wherein the latch assembly is pushed down to align the tilt relief profiles with the mounting and base surfaces so that an actuation force applied to the handle portion radially tilts the latch assembly in the latch slot to effectuate a latching and an unlatching of the latch profile with the connector.

2. The attachment mechanism as set forth in claim 1, wherein the stop is a fastener selected from the group consisting of a screw, a pin, a cotter pin, a dowel, a bolt, a nut and bolt, and a rivet.

3. The attachment mechanism as set forth in claim 1, wherein the spring is a component selected from the group consisting of a coil spring, a leaf spring, a compressible rubber material, and a compressible polyurethane material.

4. The attachment mechanism as set forth in claim 3, wherein the coil spring includes opposing ends and an inside diameter, and the keeper and the spring guide are positioned within the inside diameter of the opposing ends of the spring.

5. The attachment mechanism as set forth in claim 1 and further comprising:
    a handle connected with the handle portion of the latch assembly, the handle adapted to be gripped by a hand so that the latch assembly can be actuated to latch or unlatch the latch profile with the connector.

6. The attachment mechanism as set forth in claim 1, wherein the bore is fixedly connected with the cooling device.

7. The attachment mechanism as set forth in claim 6, wherein the bore is fixedly connected with the cooling device by a press fit between the bore and the cooling device.

8. The attachment mechanism as set forth in claim 7, wherein a portion of the cooling device is crimped to connect the cooling device with the plate.

9. The attachment mechanism as set forth in claim 1, wherein the aperture of the hinge portion includes an aperture profile selected to match a complementary profile on the connector.

10. The attachment mechanism as set forth in claim 1, wherein the latch profile is selected to match a complementary profile on the connector.

11. The attachment mechanism as set forth in claim 1, wherein the hinge slot and the latch slot are positioned on the plate in a selected one of a symmetrical relation and a non-symmetrical relation.

12. The attachment mechanism as set forth in claim 1, wherein the hinge is fixedly connected with the hinge slot by a press fit between the hinge slot and the hinge.

13. The attachment mechanism as set forth in claim 1, wherein the flange is in contact with the mounting surface and straddles the hinge slot thereby preventing complete insertion of the hinge into the hinge slot.

14. The attachment mechanism as set forth in claim 1, wherein the plate is made from a material selected from the group consisting of a metal, a metal alloy, a plastic, a composite, a ceramic, a Polycarbonate, and Altem.

15. The attachment mechanism as set forth in claim 1, wherein the latch assembly and the hinge are made from a material selected from the group consisting of a metal, a metal alloy, a plastic, a composite, a ceramic, a Polycarbonate, and Altem.

16. The attachment mechanism as set forth in claim 1, wherein the spring locator includes opposed slot engaging portions that are substantially parallel to each other and spaced apart by a distance that is less than a distance across the slot.

17. The attachment mechanism as set forth in claim 1, wherein the tilt relief profiles have a profile selected from the group consisting of a slope profile and an arcuate profile.

18. The attachment mechanism as set forth in claim 1, wherein the load force is selected from the group consisting of a load force greater than 25.0 lbs, a load force from about 15.0 lbs to about 18.0 lbs, and a load force from about 18.0 lbs to about 22.0 lbs.

19. The attachment mechanism as set forth in claim 1, wherein the load force is substantially aligned along a load axis of the cooling device and the component.

20. The attachment mechanism as set forth in claim 1, wherein the radial rotation is in a range selected from the group consisting of a range from about 5.0 degrees to about 60.0 degrees, a range from about 5.0 degrees to about 45.0 degrees, and a range from about 10.0 degrees to about 30.0 degrees.

* * * * *